United States Patent
Yang et al.

(10) Patent No.: US 9,535,858 B2
(45) Date of Patent: Jan. 3, 2017

(54) SIGNAL PROCESSING SYSTEM AND ASSOCIATED METHOD

(71) Applicant: MEDIATEK Inc., Hsin-Chu (TW)

(72) Inventors: Chien-Chung Yang, Kaohsiung (TW); Chia-Feng Chiang, Hsinchu (TW); Chien-Ming Chen, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 295 days.

(21) Appl. No.: 14/173,870

(22) Filed: Feb. 6, 2014

(65) Prior Publication Data

US 2014/0258569 A1    Sep. 11, 2014

Related U.S. Application Data

(60) Provisional application No. 61/774,118, filed on Mar. 7, 2013.

(51) Int. Cl.
| | |
|---|---|
| *G06F 13/12* | (2006.01) |
| *G06F 13/38* | (2006.01) |
| *G06F 13/10* | (2006.01) |
| *H03M 3/00* | (2006.01) |
| *G06F 3/00* | (2006.01) |

(52) U.S. Cl.
CPC .............. *G06F 13/10* (2013.01); *G06F 3/00* (2013.01); *H03M 3/462* (2013.01); *H03M 3/508* (2013.01)

(58) Field of Classification Search
None
See application file for complete search history.

(56) References Cited

U.S. PATENT DOCUMENTS

| | | | |
|---|---|---|---|
| 8,331,887 B2 | 12/2012 | Tuttle et al. | |
| 2005/0259609 A1* | 11/2005 | Hansquine | H04L 12/403 370/328 |
| 2007/0222650 A1* | 9/2007 | Park | H04L 25/45 341/100 |
| 2007/0257206 A1 | 11/2007 | Gorrell | |
| 2012/0106539 A1* | 5/2012 | Ferraiolo | G06F 13/4204 370/351 |

(Continued)

FOREIGN PATENT DOCUMENTS

CN    1534560 A    10/2004

OTHER PUBLICATIONS

Kenneth Boyce: "An Introduction to the Mobile Industry Processor Interface (MIPI) Alliance Standard"; Serial Low-power Inter-chip Media Bus (SLIMbusTM); MIPI Alliance, Inc. c/o IEEE-ISTO; Copyright 2014 MIPI Alliance, Inc. All rights reserved.

(Continued)

*Primary Examiner* — Michael Sun
(74) *Attorney, Agent, or Firm* — McClure, Qualey & Rodack, LLP

(57) ABSTRACT

The present invention provides a signal processing system and associated method. The signal processing system includes converter(s) for conversion between digital and analog, each converter includes multiple serially coupled units forming multiple frequency interfaces respectively associating with different frequencies, and each converter is partitioned, at a selected frequency interface, to a first portion and a second portion respectively formed in the first chip and the second chip. The partitioning frequency interface is selected to reduce implement cost.

19 Claims, 9 Drawing Sheets

(56) References Cited

U.S. PATENT DOCUMENTS

| | | | | |
|---|---|---|---|---|
| 2013/0159761 A1* | 6/2013 | Baumgartner | ............ | H04L 1/22 |
| | | | | 714/4.5 |
| 2013/0197920 A1* | 8/2013 | Lesso | .................. | H04L 25/4902 |
| | | | | 704/500 |
| 2013/0275873 A1* | 10/2013 | Shaw | .................... | G01S 3/8006 |
| | | | | 715/716 |

OTHER PUBLICATIONS

"I2S bus specification"; Philips Semiconductors; Feb. 1986; Revised: Jun. 5, 1996; pp. 1-7.
SIPO Office Action dated Jun. 24, 2016 in Chinese application (No. 201410078322.8).

* cited by examiner

SIGNAL PROCESSING SYSTEM AND ASSOCIATED METHOD

This application claims the benefit of U.S. provisional application No. 61/774,118, filed Mar. 7, 2013, the subject matter of which is incorporated herein by reference.

FIELD OF THE INVENTION

The present invention relates to a signal processing system and associated method, and more particularly, to a signal processing system and associated method optimizing implement cost by properly partitioning the signal processing system to different portions formed in different chips.

BACKGROUND OF THE INVENTION

Multimedia, e.g., audio and/or video, playback and/or collecting (receiving, capturing, recording, etc) are popular and even essential functions of modern electronics, such as mobile phones, smart phones, tablet/notebook computers, wearable gadgets, digital cameras and camcorders, navigators (e.g., satellite positioning electronics), surveillance apparatuses, hand-held devices and portable computers. To handle multimedia playback and collecting, conventional architecture integrates analog-to-digital converter (ADC) and digital-to-analog converter (DAC) into a codec chip to cooperate with a main chip, such as a CPU, an application processor or a baseband processor. The codec chip and the main chip interchange signals via an inter-chip connection mechanism.

For example, to accomplish audio playback and collecting, the codec chip bridges the main chip to one or more speakers and one or more microphones. For audio playback, the main chip provides digital audio signals to be played, which are transmitted to the codec chip via the inter-chip connection mechanism, and are converted to analog output signals by the codec chip to actuate the speakers. For audio collecting, the codec chip converts analog audio signals picked by the microphones to digital signals, which are then transmitted to the main chip via the inter-chip connection mechanism.

In prior arts, the inter-chip connection mechanism relaying digital audio signals between the main chip and the codec chip is implemented by I2S (inter-IC sound) bus or Slimbus. For bi-directional interchange of 2-channel stereo digital audio signals between the main chip and the codec chip, I2S requires at least three inter-chip wires, so the main chip needs three balls (pins) and the codec chip need another three balls. If more channels are demanded, I2S requires more wires and therefore more balls of both the main chip and the codec chip. Consequently, I2S bus suffers high pin-count (count of balls) and complex inter-chip wiring.

On the other hand, Slimbus can support bi-directional digital audio interchange of many channels by two-wire inter-chip communication between the main chip and the codec chip. However, Slimbus needs to implement complex network layers, including physical layer, frame layer and higher layers of message protocol and transport protocol, for both of the main chip and the codec chip. Consequently, Slimbus suffers high hardware complexity and area overhead for both of the main chip and the codec chip.

SUMMARY OF THE INVENTION

By recognizing that DAC and/or ADC can be implemented by sigma-delta modulation along with multiple up-sampling filters and/or down-sampling decimators which convert between different frequencies, the invention discloses a flexible multimedia architecture and associated method which can optimize (e.g., reduce and/or minimize) implement cost among affecting factors including circuit layout area, pin-count of inter-chip connection, as well as throughput and clock rate of inter-chip communication.

An objective of the invention is providing a signal processing system distributed across a first chip and a second chip. For example, the signal processing system can be an audio codec system for conversion between digital audio signals and analog audio signals; the first chip can be a high-speed digital integrated circuit made by advanced, expensive manufacturing (fabrication) process of finer process size (e.g., in nanometers), and the second chip can be a mixed-signal integrated circuit made by mature and low-cost manufacturing process of larger process size (e.g., in microns).

The signal processing system includes a first inter-chip connection circuit formed in the first chip, a second inter-chip connection circuit formed in the second chip and coupled to the first inter-chip connection circuit, and a quantity of converters for conversion between digital and analog. Each converter includes a plurality of serially coupled units forming a plurality of frequency interfaces; different frequency interfaces respectively associate with different frequencies, and each of the units is capable of converting frequencies between two consecutive frequency interfaces. The first inter-chip connection circuit and the second inter-chip connection circuit partition each converter to a first portion and a second portion at a corresponding one of the frequency interfaces of each converter. The first portion and the second portion of each converter are respectively formed in the first chip and the second chip, and the first inter-chip connection circuit and the second inter-chip connection circuit are arranged to relay signal between the first portion and the second portion of each converter.

In an embodiment, the signal processing system has a quantity (P+Q) of converters, including a number P (one or more) of digital-to-analog converters DA[1] to DA[P] for stereo audio playback of P channels, and a number Q (one or more) of analog-to-digital converters AD[1] to AD[Q] for stereo audio collecting of Q channels. For example, the number P can equal 2, and the number Q can also equal 2.

Each converter DA[p] (for p=1 to P) is capable of converting a digital input signal $Sa[p,0]$ to an analog output signal $Sa[p,Nu+2]$, and includes: a number Nu of serially coupled units $U[p,1]$ to $U[p,Nu]$, a DAC interface circuit IA[p] coupled to the last unit $U[p,Nu]$, and a DAC stage DAs[p] coupled to the DAC interface circuit IA[p]. In an embodiment, the number Nu is equal to 3. Each unit $U[p,i]$ (for i=1 to Nu), e.g., an up-sampling finite impulse response (FIR) filter, is capable of converting different frequencies between two consecutive frequency interfaces. The first unit $U[p,1]$ of the converter DA[p] is capable of receiving the digital input signal $Sa[p,0]$ and accordingly providing a signal $Sa[p,1]$ of a higher sampling frequency, each successive unit $U[p,i]$ (i greater than 1) is capable of receiving a signal $Sa[p,i-1]$ provided by a preceding unit $U[p,i-1]$ and accordingly providing another signal $Sa[p,i]$ of a higher sampling frequency. That is, the signals $Sa[p,0]$ to $Sa[p,Nu]$ respectively transmit across (Nu+1) frequency interfaces of different frequencies, e.g., of increasing sampling frequencies. The DAC interface circuit IA[p] is capable of modulating a signal $Sa[p,Nu]$ provided by the last unit $U[p,Nu]$ to form a modulated signal $Sa[p,Nu+1]$ by sigma-delta modulation, and the DAC stage DAs[p] is capable of converting the modulated signal Sa[p,Nu+1] to the analog output signal Sa[p,Nu+2]. The first and second inter-chip connection circuits partition each converter DA[p] to a first portion X1[p] and a second portion X2[p] at a corresponding frequency interface of signal Sa[p,ix], where the index ix is a constant selected from 1 to Nu. Accordingly, the first portion X1[p] formed in the first chip includes the units U[p,1] to U[p,ix], and the second portion X2[p] formed in the second chip includes the DAC interface circuit IA[p], the DAC stage DAs[p], and the units U[p,ix+1] to U[p,Nu] if the index ix is less than Nu.

Each converter AD[q] (for q=1 to Q) is capable of converting an analog input signal Sb[q,0] to an digital output signal Sb[q,Nd+1], and includes: a number Nd of serially coupled units D[q,1] to D[q,Nd], and an ADC interface circuit ID[q] coupled to the first unit D[q,1]. In an embodiment, the number Nd is equal to the number Nu, e.g., 3. The ADC interface circuit ID[q] is capable of providing a modulated signal Sb[q,1] in response to the signal Sb[q,0] by sigma-delta modulation. Each unit D[q,j] (for j=1 to Nd), e.g., a decimator, is capable of converting different frequencies between two consecutive frequency interfaces. The first unit D[q,1] of the converter AD[q] is capable of receiving the signal Sb[q,1] and accordingly providing a signal Sb[q,2] of a lower sampling frequency, each successive unit D[q,j] (j greater than 1 but less than Nd) is capable of receiving a signal Sb[q,j] provided by a preceding unit D[q,j−1] and accordingly providing another signal Sb[q,j+1] of a lower sampling frequency to a successive unit D[q,j+1]. The last unit D[q,Nd] is capable of receiving a signal Sb[q,Nd] provided by a preceding unit D[q,Nd−1] and accordingly providing the digital output signal Sb[q,Nd+1] of a lower sampling frequency. That is, the signals Sb[q,1] to Sb[q,Nd+1] respectively transmits across (Nd+1) frequency interfaces of different frequencies, e.g., of decreasing sampling frequencies. The first and second inter-chip connection circuits partition each converter AD[q] to a first portion Y1[q] and a second portion Y2[q] at a corresponding frequency interface of signal Sb[q,jx], where the index jx is a constant selected from 1 to Nd. Accordingly, the second portion Y2[q] formed in the second chip includes the ADC interface circuit ID[q] and the units D[q,1] to D[q,jx−1] if the index jx is greater than 1, and the first portion Y1[q] formed in the first chip includes the units D[q,jx] to D[q,Nd].

Because each converter DA[p] is partitioned between the units U[p,ix] and U[p,ix+1], the signal Sa[p,ix] (as a first inter-unit signal) needs to be transferred from the unit U[p,ix] of the portion X1[p] to the unit U[p,ix+1] of the portion X2[p]. To accomplish the transfer, the first inter-chip connection circuit is capable of collectively arranging samples in the signals Sa[1,ix] to Sa[P,ix] of the first portions X1[1] to X1[P] to form an amount K (one or more) of first streams, and transmitting the amount K of first streams respectively via a same amount of first data balls of the first inter-chip connection circuit. The second inter-chip connection circuit is capable of receiving the amount K of first streams via a same amount of second data balls of the second inter-chip connection circuit respectively coupled to the amount K of first data balls, rearranging samples in the amount K of first streams, and accordingly obtaining the signals Sa[1,ix] to Sa[P,ix] for the portions X2[1] to X2[P] of the converters DA[1] to DA[P]. In an embodiment, the amount K is less than the number Nu. For example, the amount K can equal 1.

Similarly, because each converter AD[q] is partitioned between the units D[q,jx−1] and D[q,jx], the signal Sb[q,jx] (as a second inter-unit signal) needs to be transferred from the unit D[q,jx−1] of the portion Y2[q] to the unit D[q,jx] of the portion Y1[q]. To accomplish the transfer, the second inter-chip connection circuit is further capable of collectively arranging samples in the signals Sb[1,jx] to Sb[Q,jx] of the portions Y2[1] to Y2[Q] to form an amount K of second streams, and transmitting the amount K of second streams respectively via the amount K of second data balls of the second inter-chip connection circuit. The first inter-chip connection circuit is further capable of receiving the amount K of second streams via the amount K of first data balls of the first inter-chip connection circuit, rearranging samples in the amount K of second streams, and accordingly obtaining the signals Sb[1,jx] to Sb[Q,jx] for the portions Y1[1] to Y1[Q] of the converters AD[1] to AD[Q].

In an embodiment, the frequency of the signal Sa[p,ix] across the frequency interface partitioning the portions X1[p] and X2[p] is equal to the frequency of the signal Sb[q,jx] across the frequency interface partitioning the portions Y2[q] and Y1[q]; that is, sampling frequency of each signal Sa[p,ix] equals sampling frequency of each signal Sb[q,jx]. In another embodiment, the frequency of the signal Sa[p,ix] across the frequency interface partitioning the portions X1[p] and X2[p] is different from the frequency of the signal Sb[q,jx] across the frequency interface partitioning the portions Y2[q] and Y1[q]; i.e., sampling frequency of each signal Sa[p,ix] differs from sampling frequency of each signal Sb[q,jx].

In an embodiment, the first inter-chip connection circuit is further capable of adding error correction information to the amount K of first streams according to the signals Sa[1,ix] to Sa[P,ix] of the portions X1[1] to X1[P], and the second inter-chip connection circuit is further capable of correcting the received amount K of first streams in response to the error correction information while obtaining the signals Sa[1,ix] to Sa[P,ix] for the portions X2[1] to X2[P]. Similarly, in an embodiment, the second inter-chip connection circuit is further capable of adding second error correction information to the amount K of second streams according to the signals Sb[1,jx] to Sb[Q,jx] of the portions Y2[1] to Y2[Q], and the first inter-chip connection circuit is further capable of correcting the received amount K of second streams in response to the second error correction information while obtaining the signals Sb[1,jx] to Sb[Q,jx] for the portions Y1[1] to Y1[Q].

In an embodiment, each converter DA[p] further includes a first encoding stage Ea[p] in the portion X1[p] and a first decoding stage Ga[p] in the portion X2[p]. The first encoding stage Ea[p] of each converter DA[p] is capable of encoding the signal Sa[p,ix] to provide a first encoded signal sc1[p]. While transmitting the amount K of first streams, the first inter-chip connection circuit arranges the signals sc1[1] to sc1[P] of the converters DA[1] to DA[P] to form the amount K of first streams, the second inter-chip connection circuit rearranges the amount K of first streams and accordingly obtains the encoded signals sc1[1] to sc1[P] for the portions X2[1] to X2[P], so the first decoding stage Ga[p] of each converter DA[p] is capable of decoding the first encoded signal sc1[p] obtained by the second inter-chip connection circuit to obtain the signal Sa[p,ix] for the portion X2[p] of each converter DA[p].

Similarly, in an embodiment, each converter AD[q] further includes a second encoding stage Eb[q] in the portion Y2[q] and a second decoding stage Gb[q] in the portion Y1[q]. The second encoding stage Eb[q] of each converter AD[q] is capable of encoding the signal Sb[q,jx] to provide a second encoded signal sc2[q]. While transmitting the amount K of second streams, the second inter-chip connection circuit arranges the signals sc2[1] to sc2[Q] of the converters AD[1] to AD[Q] to form the amount K of second streams, the first inter-chip connection circuit rearranges the amount K of second streams to accordingly obtain the signals sc2[1] to sc2[Q] for the portions Y1[1] to Y1[Q], and the second decoding stage Gb[q] of each converter AD[q] is capable of decoding the signal sc2[q] obtained by the first inter-chip connection circuit to obtain the signal Sb[q,jx] for the portion Y1[q] of each converter AD[q].

An objective of the invention is providing a method for implementing a signal processing system across a first chip and a second chip, including: arranging a quantity of converters (e.g., DA[1] to DA[P] and/or AD[1] to AD[Q]) with each converter partitioned to a first portion and a second portion respectively formed in the first chip and the second chip, and relaying an intermediate signal (e.g., Sa[p,ix] or Sb[q,jx]) between the first portion (e.g., X1[p] or Y1[q]) and the second portion (e.g., X2[p] or Y2[q]) of each converter by a first inter-chip connection circuit formed in the first chip and a second inter-chip connection circuit formed in the second chip. Wherein each converter (e.g., DA[p] or AD[q]) is capable of accepting an input signal and accordingly providing an output signal by a conversion between digital and analog; one of the first portion and the second portion is capable of converting a sampling frequency of the input signal to provide the intermediate signal of a different sampling frequency. For example, the sampling frequency of the intermediate signal of each converter may be about 4~16 times of the sampling frequency of the input signal of each converter.

A design flow for optimizing the invention may include: arranging a quantity of converters for conversion between digital and analog, each converter associating with multiple frequency interfaces of different frequencies; performing a partitioning step for partitioning each converter to a first portion and a second portion at a selected one of the frequency interfaces of each converter; by computer, performing a cost evaluation step for calculating a cost required to form the first portion(s) in the first chip, to form the second portion(s) in the second chip, and to implement inter-chip connection which relays signal between the first portion(s) and second portion(s) of the included converter(s) via a pin-count; and repeating the partitioning step and the cost evaluation step for calculating a new cost after: changing the selected partitioning frequency interface to another one for at least one of the converters, and/or changing value of the pin-count. Accordingly, several costs can be respectively calculated after repeats of the partitioning step and the cost evaluation step, each cost corresponds to a selection including a selected pin-count and/or selected partitioning frequency interface(s). Then the costs can be compared (sorted) by computer to choose a selection which can optimize (minimize) implement cost.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

each of FIG. 1 to FIG. 8 illustrates a signal processing system according to an embodiment of the invention.

DETAILED DESCRIPTION OF PREFERRED EMBODIMENTS

Figure 1:
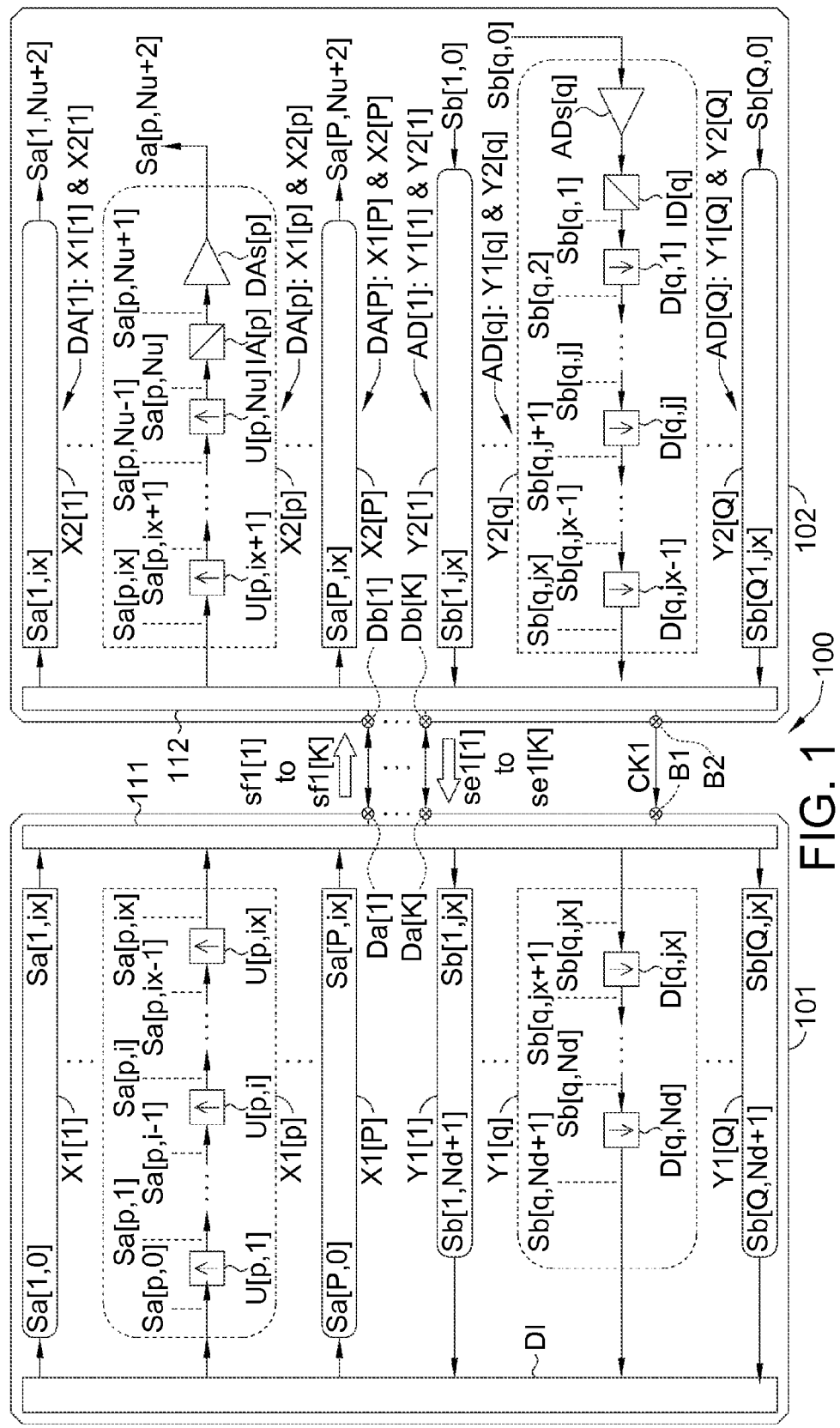

Please refer to FIG. 1 illustrating a generic signal processing system 100 according to an embodiment of the invention; the signal processing system 100 distributes across two chips 101 and 102, and includes two inter-chip connection circuits 111 and 112, and a quantity (P+Q) of converters DA[1] to DA[P] and AD[1] to AD[Q]. Each converter DA[p] (for p=1 to P) is a DAC (e.g., a sigma-delta DAC), and capable of converting a digital input signal Sa[p,0] to an analog output signal Sa[p,Nu+2]. Each converter AD[q] (for q=1 to Q) is an ADC (e.g., a sigma-delta ADC), and capable of converting an analog input signal Sb[q,0] to a digital output signal Sb[q,Nd+1]. The inter-chip connection circuits 111 and 112 are respectively formed in the chips 101 and 102, partition each converter DA[p] to two portions X1[p] and X2[p] respectively formed in the chips 101 and 102, also partition each converter AD[q] to two portions Y1[q] and Y2[q] respectively formed in the chips 101 and 102. That is, the signal processing system 100 distributes at least across the chips 101 and 102.

The chip 101 includes an amount K of external data balls (pins) Da[1] to Da[K] for data interchange, and an external clock ball (pin) B1 for receiving a clock CK1. Correspondingly, the chip 102 includes the same amount K of external data balls Db[1] to Db[K] for data interchange, and an external clock ball B2 for transmitting the clock CK1. Each pair of data balls Da[k] and Db[k] (for k=1 to K) are mutually coupled, and the clock balls B1 and B2 are mutually coupled. Via the data balls Da[1] to Da[K] and Db[1] to Db[K], the inter-chip connection circuits 111 and 112 are mutually coupled for bi-directional data transfer under clocking of the clock CK1. Accordingly, the mutually communicable inter-chip connection circuits 111 and 112 can relay signal from the portion X1[p] to the portion X2[p] for each converter DA[p], and relay signal from the portion Y2[q] to the portion Y1[q] for each converter AD[q], so each converter DA[p] can accomplish digital-to-analog conversion from the signal Sa[p,0] to the signal Sa[p,Nu+2], and each converter AD[q] can accomplish analog-to-digital conversion from the signal Sb[q,0] to the Sb[q,Nd+1].

As an example, the signal processing system 100 can be an audio codec system for conversion between digital audio signal(s) and analog audio signal(s), the chip 101 can be a high-speed digital integrated circuit made by advanced, expensive manufacturing process of finer process size (e.g., in nanometers), and the chip 102 can be a mixed-signal integrated circuit made by mature and low-cost manufacturing process of greater process size (e.g., in microns). The converters DA[1] to DA[P] are utilized for stereo audio playback of P channels, wherein the signals Sa[1,0] to Sa[P,0], as digital audio source signals of P channels to be played, are provided by a digital interface circuit DI formed in the chip 101, and are converted to the analog signals Sa[1,Nu+2] to Sa[P,Nu+2] respectively by the converters DA[1] to DA[P], so the signals Sa[1,Nu+2] to Sa[P,Nu+2] can be utilized to drive P speakers (not shown). On the other hand, the converters AD[1] to AD[Q] are utilized for stereo audio collecting of Q channels, wherein the signals Sb[1,0] to Sb[Q,0], as analog audio signals picked up by Q microphones (not shown), are respectively converted to the digital signals Sb[1,Nd+1] to Sb[Q,Nd+1] by the converters AD[1] to AD[Q], and sent to the digital interface circuit DI to be collected. In an example, the number P equals 2 for left and right channels, and the number Q also equals 2.

As shown in FIG. 1, each converter DA[p] (for p=1 to P) includes a number Nu of serially coupled units U[p,1] to U[p,Nu], a DAC interface circuit IA[p] coupled to the last unit U[p,Nu], and a DAC stage DAs[p] coupled to the DAC interface circuit IA[p]. In an embodiment, the number Nu is equal to 3. Each unit U[p,i] (for i=1 to Nu) can be an up-sampling filter for increasing sampling frequency (sampling rate). The first unit U[p,1] of each converter DA[p] is capable of receiving the signal Sa[p,0] and accordingly providing a signal Sa[p,1] of a higher sampling frequency, each successive unit U[p,i] (i greater than 1) is capable of receiving a signal Sa[p,i−1] provided by a preceding unit U[p,i−1] (not shown) and accordingly providing another signal Sa[p,i] of a higher sampling frequency. That is, the signals Sa[p,0] to Sa[p,Nu] respectively transmit across (Nu+1) frequency interfaces of different frequencies, e.g., of increasing sampling frequencies. Up-sampling of each unit U[p,i] (for i=1 to Nu) increases number of samples in the up-sampled signal Sa[p,i] by, e.g., interpolating among consecutive samples of the signal Sa[p,i−1], so number of samples in the signal Sa[p,i] is greater than number of samples in the signal Sa[p,i−1] per unit time. The DAC interface circuit IA[p] is capable of modulating a signal Sa[p,Nu] provided by the last unit U[p,Nu] to form a modulated digital signal Sa[p,Nu+1] by sigma-delta modulation, and the DAC stage DAs[p] is capable of converting the modulated signal Sa[p,Nu+1] to the analog output signal Sa[p,Nu+2].

Among the units U[p,1] to U[p,Nu] of each converter DA[p], the inter-chip connection circuits 111 and 112 partition the converter DA[p] to the portions X1[p] and X2[p] at a corresponding frequency interface of signal Sa[p,ix], where the index ix is a constant selected from 1 to Nu. Accordingly, if the index ix is less than the number Nu, the portion X1[p] formed in the chip 101 includes the units U[p,1] to U[p,ix], and the portion X2[p] formed in the chip 102 includes the units U[p,ix+1] to U[p,Nu], the DAC interface circuit IA[p] and the DAC stage DAs[p]. If the index ix is selected to equal the number Nu, the portion X1[p] includes all the units U[p,1] to U[p,Nu], and the portion X2[p] includes the DAC interface circuit IA[p] and the DAC stage DAs[p].

As demonstrated in FIG. 1, each converter AD[q] (for q=1 to Q) includes a number Nd of serially coupled units D[q,1] to D[q,Nd], an ADC interface circuit ID[q] coupled to the first unit D[q,1], and an ADC stage ADs[q] coupled to the ADC interface circuit ID[q]. In an embodiment, the number Nd is set equal to the number Nu, e.g., 3. The ADC interface circuit ID[q] and the ADC stage ADs[q] are integrated to modulate the signal Sb[q,0] by sigma-delta modulation and accordingly provide a modulated digital signal Sb[q,1] in response. Each unit D[q,j] (for j=1 to Nd) is capable of converting different frequencies between two consecutive frequency interfaces; for example, each unit D[q,j] can be an decimator for decreasing sampling frequency (sampling rate). The first unit D[q,1] of the converter AD[q] is capable of receiving the signal Sb[q,1] and accordingly providing a signal Sb[q,2] of a lower sampling frequency, each successive unit D[q,j] (j greater than 1 but less than Nd) is capable of receiving a signal Sb[q,j] provided by a preceding unit D[q,j−1] (not shown) and accordingly providing another signal Sb[q,j+1] of a lower sampling frequency to a successive unit D[q,j+1] (not shown). The last unit D[q,Nd] is capable of receiving a signal Sb[q,Nd] provided by a preceding unit D[q,Nd−1] (not shown) and accordingly providing the digital output signal Sb[q,Nd+1] of a lower sampling frequency. That is, the signals Sb[q,1] to Sb[q,Nd+1] respectively transmits across (Nd+1) frequency interfaces of different frequencies, e.g., of decreasing sampling frequencies. Down-sampling of the units D[q,j] (for j=1 to Nd) decreases number of samples in the down-sampled signal Sb[q,j+1] by, e.g., discarding samples among samples of the signal Sb[q,j], so number of samples in the signal Sb[q,j+1] is less than number of samples in the signal Sb[q,j] per unit time.

Among the units D[q,1] to D[q,Nd] of each converter AD[q], the inter-chip connection circuits 111 and 112 partition the converter AD[q] to the portions Y1[q] and Y2[q] at a corresponding frequency interface of signal Sb[q,jx], where the index jx is a constant selected from 1 to Nd. Accordingly, if the index jx is greater than 1, the portion Y2[q] formed in the chip 102 includes the ADC stage ADs[q], the ADC interface circuit ID[q] and the units D[q,1] to D[q,jx−1], and the portion Y1[q] formed in the chip 101 includes the units D[q,jx] to D[q,Nd]. If the index jx is selected to equal 1, the portion Y2[q] formed in the chip 102 includes the ADC stage ADs[q] and the ADC interface circuit ID[q], and the portion Y1[q] formed in the chip 101 includes the units D[q,1] to D[q,Nd].

Because each converter DA[p] is partitioned between the units U[p,ix] and U[p,ix+1], the signal Sa[p,ix] (as an inter-unit signal) needs to be transferred from the unit U[p,ix] of the portion X1[p] to the unit U[p,ix+1] of the portion X2[p]. To accomplish the transfer, the inter-chip connection circuit 111 is capable of arranging samples in the signals Sa[1,ix] to Sa[P,ix] of the portions X1[1] to X1[P] to form an amount K of streams sf1[1] to sf1[K], and transmitting the streams sf1[1] to sf1[K] respectively via the data balls Da[1] to Da[K] of the inter-chip connection circuit 111. Under clocking of the clock CK1, the inter-chip connection circuit 112 is capable of receiving the streams sf1[1] to sf1[K] via the data balls Db[1] to Db[K] of the inter-chip connection circuit 112, rearranging samples in the streams sf1[1] to sf1[K], and accordingly obtaining the signals Sa[1,ix] to Sa[P,ix] for the portions X2[1] to X2[P] of the converters DA[1] to DA[P].

Optionally, the inter-chip connection circuit 111 is further capable of adding error correction information (e.g., error correction codes) to the streams sf1[1] to sf1[K] according to the signals Sa[1,ix] to Sa[P,ix] of the portions X1[1] to X1[P]. The inter-chip connection circuit 112 is further capable of detecting errors of the received streams sf1[1] to sf1[K] by checking the error correction information, and correcting the streams sf1[1] to sf1[K], if necessary and possible, according to the error correction information while obtaining the signals Sa[1,ix] to Sa[P,ix] for the portions X2[1] to X2[P].

Similarly, because each converter AD[q] is partitioned between the units D[q,jx−1] and D[q,jx], the signal Sb[q,jx] (as an inter-unit signal) needs to be transferred from the unit D[q,jx−1] of the portion Y2[q] to the unit D[q,jx] of the portion Y1[q]. To accomplish the transfer, the inter-chip connection circuit 112 is further capable of arranging samples in the signals Sb[1,jx] to Sb[Q,jx] of the portions Y2[1] to Y2[Q] to form an amount K of streams se1[1] to se1[K], and transmitting the streams se1[1] to se1[K] respectively via the data balls Db[1] to Db[K] of the chip 102. The inter-chip connection circuit 111 is further capable of receiving the streams se1[1] to se1[K] via the data balls Da[1] to Da[K] of the chip 101, rearranging samples in the streams se1[1] to se1[K], and accordingly obtaining the signals Sb[1,jx] to Sb[Q,jx] for the portions Y1[1] to Y1[Q] of the converters AD[1] to AD[Q].

Optionally, the inter-chip connection circuit 112 is also capable of adding error correction information to the streams se1[1] to se1[K] according to the signals Sb[1,jx] to Sb[Q,jx] of the portions Y2[1] to Y2[Q]. The inter-chip connection circuit 111 is further capable of detecting errors of the received streams se1[1] to se1[K] by checking the error correction information, and correcting the streams se1[1] to se1[K], if necessary and possible, according to the error correction information while obtaining the signals Sb[1,jx] to Sb[Q,jx] for the portions Y1[1] to Y1[Q].

In an embodiment, the amount K is less than either the number Nu or the number Nd, hence the pin-count (amount K) for implementing (P+Q) channels can be reduced. For example, the amount K can be set equal to 1; that is, the inter-chip signal relay between the portions X1[1] to X1[P], Y1[1] to Y1[Q] and the potions X2[1] to X2[P], Y2[1] to Y2[Q] can be accomplished using a single pair of data balls Da[1] and Db[1], alone with the pair of clock balls B1 and B2. With the amount K equal to 1, the inter-chip connection circuit 111 can serialize the samples in the parallel signals Sa[1,ix] to Sa[P,ix] (and the optionally added error correction information) into a single stream sf1[1], and transmit the stream sf1[1] via the single data ball Da[1] allocated for the signal processing system 100. For example, the inter-chip connection circuit 111 can sequentially transmit each bit of a sample in the signal Sa[1,ix] (alone with its error correction code if the optional error correction function is adopted), then sequentially transmit each bit of a concurrent sample in the signal Sa[2,ix] (alone with its error correction code), and so on. Correspondingly, the inter-chip connection circuit 112 can receive the single stream sf1[1] from the single data ball Db[1], and de-serialize the samples in the stream sf1[1] to recover the parallel signals Sa[1,ix] to Sa[P,ix] for the portions X2[1] to X2[P] of the converters DA[1] to DA[P]. For example, the inter-chip connection circuit 112 can buffer (e.g., by flip-flops) sequentially received bits in the stream sf1[1] and, by counting if received bits is enough to assemble a sample (and its error correction code), group the bits to rebuild concurrent samples (and their error correction codes) of the parallel signals Sa[1,ix] to Sa[P,ix] (and detect and correct error of each sample), so the signals Sa[1,ix] to Sa[P,ix] can be relayed to the portions X2[1] to X2[P].

Vice versa, for the amount K equal to 1, the inter-chip connection circuit 112 can serialize the samples in the parallel signals Sb[1,jx] to Sb[Q,jx] (and the optionally added error correction information) into a single stream se1[1], and transmit the stream se1[1] via the single data ball Db[1]. In response, the inter-chip connection circuit 111 can receive the single stream se1[1] from the single data ball Da[1], and de-serialize the samples in the stream se1[1] to recover the parallel signals Sb[1,jx] to Sb[Q,jx] for the portions Y1[1] to Y1[Q] of the converters AD[1] to AD[Q].

Because the inter-chip connection circuits 111 and 112 only need to perform simple functions such as data arrange and rearrange (and optionally error correction), they can be implemented by rather simple circuitry, in contrast to complicated circuitry demanded to support sophisticated communication layers and protocols like Slimbus. Although the signals Sa[1,0] to Sa[P,0] can be PCM (Pulse-Code Modulation) digital signals, the signals Sa[1,ix] to Sa[P,ix] do not have to be PCM digital signals.

In an embodiment, the clock CK1 is supplied to the inter-connection circuit 111 by the inter-connection circuit 112; the clock CK1 is aligned with timing of the portions X2[1] to X2[P] and Y2[1] to Y2[Q] in the chip 102, so the inter-connect circuit 112 can synchronize the streams sf1[.] and se1[.] to align timing of the portions X2[.] and Y2[.]. To satisfy operation timing of the portions X1[.], X2[.], Y1[.] and Y2[.], clock rate of the clock CK1, as well as throughput of the streams sf1[1] to sf1[K] and se1[1] to se1[K], can be determined according to at least one of: values of the numbers P and Q, the amount K, number of bits in each sample of the signal Sa[p,ix] and Sb[q,jx] (and error correction information), and sampling frequencies of the signals Sa[p,ix] and Sb[q,jx]. For example, clock rate of the clock CK1 needs to be set higher if value of the numbers P and/or Q are greater, if value of the amount K is less, and/or if sampling rates of the signals Sa[.,ix] and/or Sb[.,jx] are higher. For the numbers P=Q=2, setting the amount K equal to 1 may be technically adequate and feasible. Considering clock rate, if the number P or Q is greater than 2, the amount K may be set to 2, 3 or more. That is, while only one pair of clock balls is adopted, the amount K may be scalable.

According to up-sampling and down-sampling structures shown in FIG. 1, frequency of the signal Sa[p,i] is higher than frequency of the signal Sa[p,i−1], for i=1 to Nu; on the other hand, frequency of the signal Sb[q,j] is higher than frequency of the signal Sb[q,j+1], for j=1 to Nd. By changing the partitioning frequency interface(s) (e.g., the index ix selected from 1 to Nu and/or the index jx selected from 1 to Nd) and/or the pin-count (the amount K), the invention provides flexibility to optimize overall cost for implementing the signal processing system 100.

Under a same value of the amount K, as the index ix is selected closer to the number Nu and/or the index jx is selected closer to 1, more circuitry (e.g., more units U[p,.] and D[q,.]) needs to be implemented by the chip 101, less circuitry needs to be implemented by the chip 102; also, throughput via the data balls Da[1] to Da[K] and Db[1] to Db[K], as well as clock rate of the clock CK1, need to increase, because the partitioning frequency interfaces are corresponding to signals of higher sampling frequencies. To implement more circuitry in the chip 101, cost and layout overhead may increase, high-speed inter-chip connection may also increase cost; however, cost may be reduced since the chip 102 implements less circuitry which lowers layout overhead. Manufacturing technology of the chips 101 and 102 also affects cost balancing; if the chip 101 is made by advanced process of smaller process size, layout overhead to implement more circuitry may not increase too much; on the other hand, if the chip 102 is made by mature process of greater process size, effect of cost reduction may be impacted. In addition, value of the amount K affects implement cost; as the amount K increases, inter-chip connection throughput and clock rate can be lowered to reduce cost, but greater value of the amount K also increases pin-count and complexity of inter-chip wiring, thus compromises effect of cost reduction.

Although it is difficult to intuitively estimate cost to implement the signal processing system 100, costs corresponding to different selections of the partitioning frequency interfaces and the amount K can be accurately evaluated by computer. By comparing the costs, the selection which costs least can be actually adopted to implement the signal processing system 100.

Figure 2:
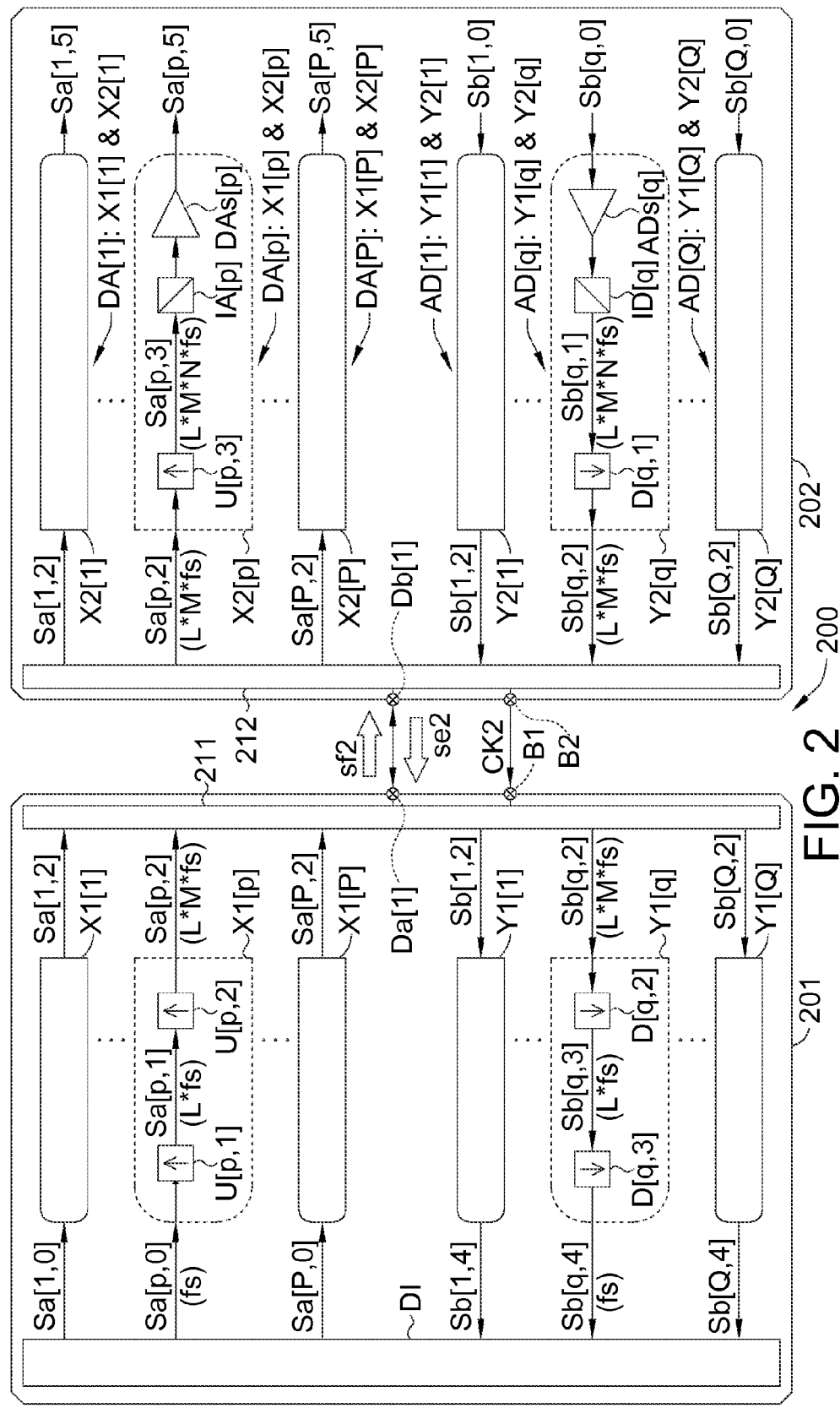

Please refer to FIG. 2 illustrating a signal processing system 200 according to an embodiment of the invention. Following the architecture shown in FIG. 1, the signal processing system 200 in FIG. 2 distributes across two chips 201 and 202, and adopts three-level up-sampling for digitalto-analog and three-level down-sampling for analog-to-digital, thus the numbers Nu=Nd=3. The signal processing system 200 includes a number P of DACs DA[1] to DA[P] and a number Q of ADCs AD[1] to AD[Q]. Each converter DA[p] (for p=1 to P) includes units U[p,1] to U[p,3] for up-sampling, a DAC interface circuit IA[p] and a DAC stage DAs[p]. Each converter AD[q] (q=1 to Q) includes an ADC stage ADs[q], an ADC interface circuit ID[q] and units D[q,1] to D[q,3] for down-sampling.

A digital interface circuit DI in the chip 201 provides digital input signals Sa[1,0] to Sa[P,0] of frequency fs. Each signal Sa[p,0] (p=1 to P) is up-sampled by the unit U[p,1] to accordingly provide a signal Sa[p,1] of frequency L*fs; that is, up-sampling operation of the unit U[p,1] multiplies the frequency fs of the signal Sa[p,0] by a factor L. Similarly, the units U[p,2] and U[p,3] respectively provide frequency multiplying factors M and N by up-sampling, so as to output a signal Sa[p,2] of frequency L*M*fs and a signal Sa[p,3] of frequency L*M*N*fs.

In each converter AD[q], the ADC stage ADs[q] and the ADC interface circuit ID[q] cooperate to receive an analog input signal Sb[q,0] and accordingly provide a digital signal Sb[q,1] of frequency L*M*N*fs. The signal Sb[q,1] is down-sampled by the unit D[q,1] to accordingly provide a signal Sb[q,2] of frequency L*M*fs; that is, down-sampling operation of the unit D[q,1] divides the frequency L*M*N*fs of the signal Sb[q,0] by the factor N. Similarly, the units D[q,2] and D[q,3] respectively provide frequency dividing factors M and L by down-sampling, so as to output a signal Sb[q,3] of frequency L*fs and a signal Sb[q,4] of frequency fs.

The signal processing system 200 is partitioned by selecting the indices ix and jx both equal to 2, and the inter-chip connection is constructed by selecting the amount K equal to 1. Accordingly, each converter DA[p] is segmented to two portions X1[p] and X2[p] respectively implemented by the chip 201 and 202; the units U[p,1] and U[p,2] are included in the portion X1[p], and the unit U[p,3] belongs to the portion X2[p]. The signals Sa[1,2] to Sa[P,2] of frequency L*M*fs respectively provided by the portions X1[1] to X1[P] are relayed to the portions X2[1] to X2[P] via a single stream sf2 over a single pair of data balls Da[1] and Db[1] of inter-chip connection circuits 211 and 212.

Similarly, each converter AD[q] is segmented to two portions Y1[q] and Y2[q] respectively implemented by the chip 201 and 202; the units D[q,2] and D[q,3] are included in the portion Y1[q], and the unit D[p,1] belongs to the portion Y2[q]. The signals Sb[1,2] to Sb[Q,2] of frequency L*M*fs respectively provided by the portions Y2[1] to Y2[Q] are relayed to the portions Y1[1] to Y1[Q] via a single stream se2 over the single pair of data balls Db[1] and Da[1] of the inter-chip connection circuits 212 and 211. A clock CK2 from a clock ball B2 of the chip 202 to a clock ball B1 of the chip 201 is arranged to clock the streams sf2 and se2. Clock rate of the clock CK2 and throughput of the streams sf2 and se2 are determined according to the frequency L*M*fs, so as to satisfy timing requirement of bi-directional serialized transfer of the signals Sa[1,2] to Sa[P,2] and Sb[1,2] to Sb[Q,2].

Figure 3:
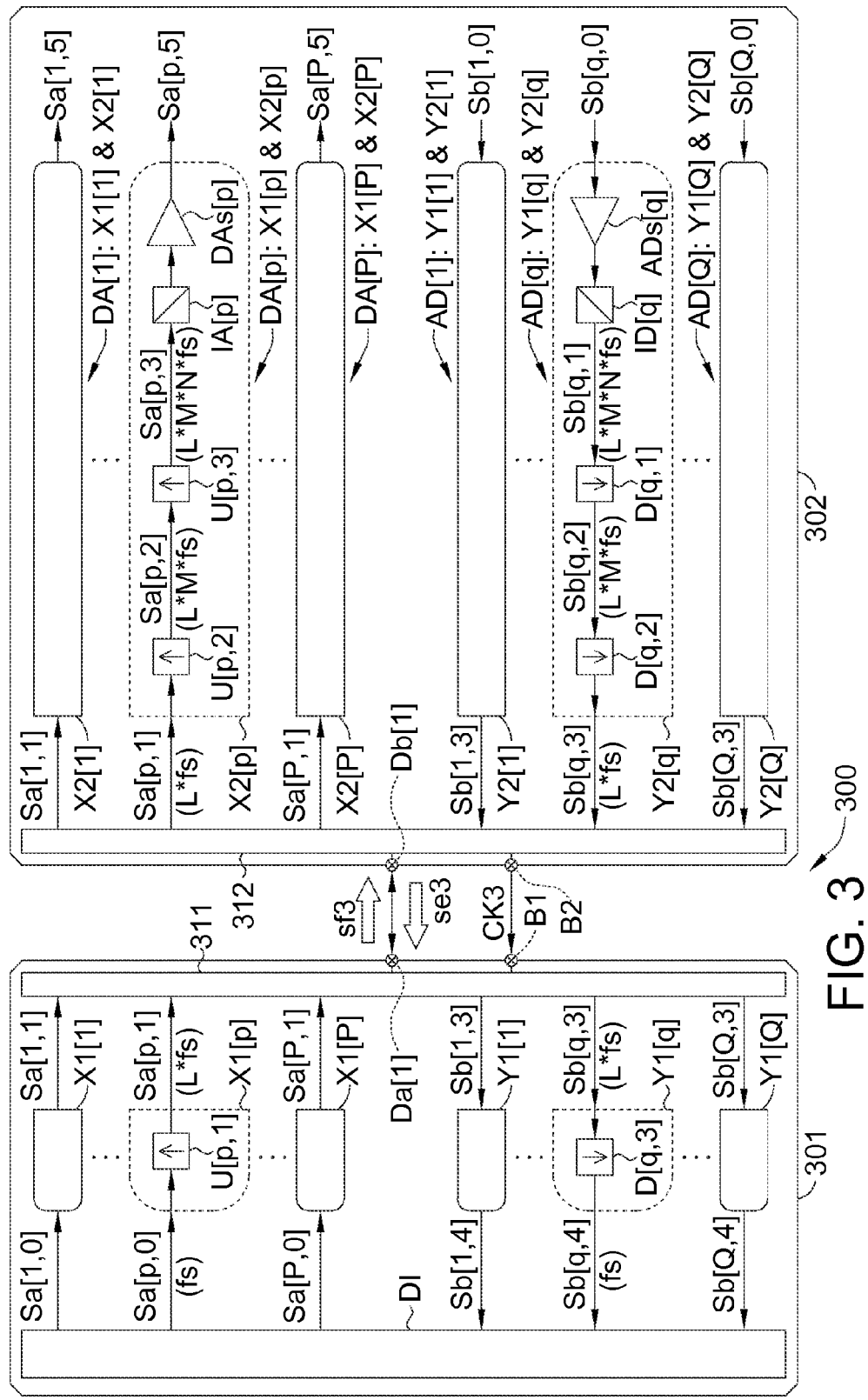

Please refer to FIG. 3 illustrating a signal processing system 300 according to an embodiment of the invention. Similar to FIG. 2, the signal processing system 300 shown in FIG. 3 is built across two chips 301 and 302, and includes converters DA[1] to DA[P] for digital-to-analog conversion and converters AD[1] to AD[Q] for analog-to-digital conversion. Each converter DA[p] (for p=1 to P) receives a digital input signal Sa[p,0] of sampling frequency fs from a digital interface circuit DI, and includes units U[p,1] to U[p,3] for up-sampling, so the signal Sa[p,0] of frequency fs is converted to a signal Sa[p,1] of frequency L*fs, a signal Sa[p,2] of frequency L*M*fs, and a signal Sa[p,3] of frequency L*M*N*fs. Each converter AD[q] (q=1 to Q) performs sigma-delta analog-to-digital conversion on an analog input signal Sb[q,0] to accordingly provide a digital signal Sb[q,1] of sampling frequency L*M*N*fs, and includes units D[q,1] to D[q,3] for down-sampling, so the signal Sb[q,1] of frequency L*M*N*fs is converted to a signal Sb[q,2] of frequency L*M*fs, a signal Sb[q,3] of frequency L*fs, and a signal Sb[q,4] of frequency fs.

With the amount K kept equal to 1, one difference between embodiments of FIG. 2 and FIG. 3 is that the signal processing system 300 in FIG. 3 is partitioned at a frequency interface associated with the signals Sa[p,1] and Sb[q,3] of frequency L*fs. Accordingly, each converter DA[p] is segmented to two portions X1[p] and X2[p] respectively implemented by the chip 301 and 302; the portion X1[p] includes the unit U[p,1], and the portion X2[p] includes the units U[p,2] and U[p,3]. The signals Sa[1,1] to Sa[P,1] of frequency L*fs respectively provided by the portions X1[1] to X1[P] are transmitted to the portions X2[1] to X2[P] via a single stream sf3 over a single pair of data balls Da[1] and Db[1] of inter-chip connection circuits 311 and 312.

Similarly, each converter AD[q] is segmented to two portions Y1[q] and Y2[q] respectively implemented by the chip 301 and 302; the portion Y1[q] includes the unit D[q,3], and the portion Y2[q] includes the units D[q,2] and D[q,1]. The signals Sb[1,3] to Sb[Q,3] of frequency L*fs respectively provided by the portions Y2[1] to Y2[Q] are sent to the portions Y1[1] to Y1[Q] via a single stream se3 over the single pair of data balls Db[1] and Da[1]. A clock CK3 from a clock ball B2 of the chip 302 to a clock ball B1 of the chip 301 is arranged to clock the streams sf3 and se3.

Comparing the embodiments of FIG. 2 and FIG. 3, clock rate of the clock CK2 (FIG. 2) needs to be higher than clock rate of the clock CK3 (FIG. 3), because the signal processing system 200 (FIG. 2) is partitioned at a frequency interface of higher frequency L*M*fs, and the signal processing system 300 (FIG. 3) is partitioned at a frequency interface of lower frequency L*fs. Throughput of the streams sf2 and se2 (FIG. 2) also needs to be higher than throughput of the streams sf3 and se3 (FIG. 3). However, the chip 302 (FIG. 3) needs to implement more circuitry than the chip 202 (FIG. 2).

Figure 4:
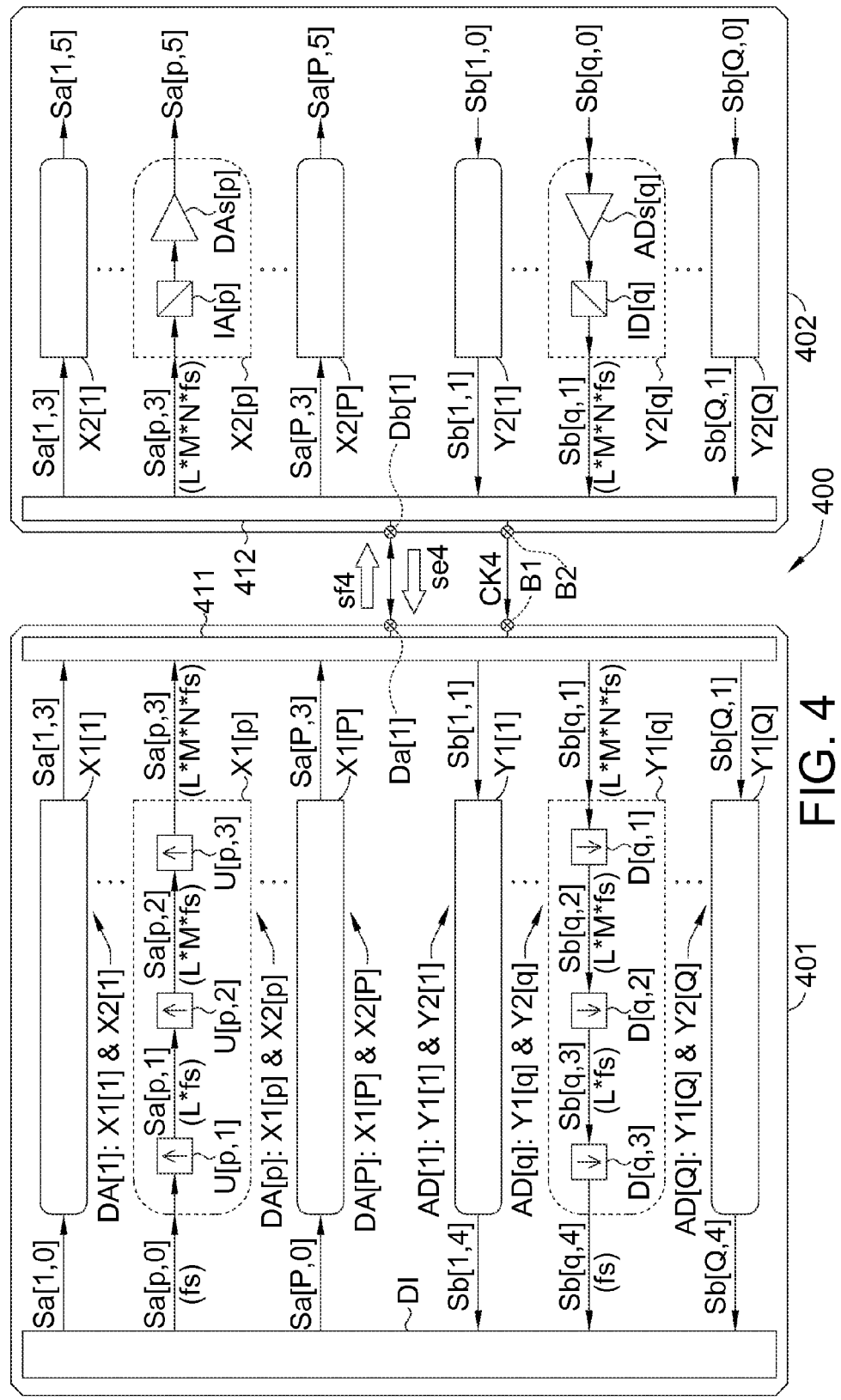

Please refer to FIG. 4 illustrating a signal processing system 400 according to an embodiment of the invention. Similar to FIG. 2 and FIG. 3, the signal processing system 400 shown in FIG. 4 distributes across two chips 401 and 402, and includes converters DA[1] to DA[P] for digital-to-analog conversion and converters AD[1] to AD[Q] for analog-to-digital conversion. Each converter DA[p] (for p=1 to P) receives a digital input signal Sa[p,0] of sampling frequency fs from a digital interface circuit DI, and includes units U[p,1] to U[p,3] for up-sampling, so the signal Sa[p,0] of frequency fs is converted to a signal Sa[p,1] of frequency L*fs, a signal Sa[p,2] of frequency L*M*fs, and a signal Sa[p,3] of frequency L*M*N*fs. Each converter AD[q] (q=1 to Q) performs sigma-delta analog-to-digital conversion on an analog input signal Sb[q,0] to accordingly provide a digital signal Sb[q,1] of sampling frequency L*M*N*fs, and includes units D[q,1] to D[q,3] for down-sampling, so the signal Sb[q,1] of frequency L*M*N*fs is converted to a signal Sb[q,2] of frequency L*M*fs, a signal Sb[q,3] of frequency L*fs, and a signal Sb[q,4] of frequency fs.

With the amount K kept equal to 1, one difference between embodiments of FIG. 2 to FIG. 4 is that the signal processing system 400 in FIG. 4 is partitioned at a frequency interface associated with the signals Sa[p,3] and Sb[q,1] of frequency L*M*N*fs. Accordingly, each converter DA[p] is segmented to two portions X1[p] and X2[p] respectively implemented by the chip 401 and 402; the portion X1[p] includes the units U[p,1], U[p,2] and U[p,3], and the portion X2[p] includes the rest circuitry of the converter DA[p], e.g., a DAC interface circuit IA[p] and a DAC stage DAs[p]. The signals Sa[1,3] to Sa[P,3] of frequency L*M*N*fs respectively provided by the portions X1[1] to X1[P] are transmitted to the portions X2[1] to X2[P] via a single stream sf4 over a single pair of data balls Da[1] and Db[1] of inter-chip connection circuits 411 and 412.

Similarly, each converter AD[q] is segmented to two portions Y1[q] and Y2[q] respectively implemented by the chip 401 and 402; the portion Y1[q] includes the units D[q,1] to D[q,3], and the portion Y2[q] includes the rest circuitry of the converter AD[q], e.g., an ADC stage ADs[q] and an ADC interface circuit ID[q]. The signals Sb[1,1] to Sb[Q,1] of frequency L*M*N*fs respectively provided by the portions Y2[1] to Y2[Q] are sent to the portions Y1[1] to Y1[Q] via a single stream se4 over the single pair of data balls Db[1] and Da[1]. A clock CK4 from a clock ball B2 of the chip 402 to a clock ball B1 of the chip 401 is arranged to clock the streams sf4 and se4.

Comparing the embodiments of FIG. 2 to FIG. 4, clock rate of the clock CK4 (FIG. 4) needs to be higher than those of the clock CK3 (FIG. 3) and the clock CK2 (FIG. 2), because the signal processing system 400 (FIG. 4) is partitioned at a frequency interface of higher frequency L*M*N*fs, while the signal processing systems 300 (FIG. 3) and 200 (FIG. 2) are respectively partitioned at frequency interfaces of lower frequencies L*fs and L*M*fs. Throughput of the streams sf4 and se4 (FIG. 4) also needs to be higher than throughput of the streams sf3 and se3 (FIG. 3) and throughput of the streams sf2 and se2 (FIG. 2). Although the chip 402 (FIG. 4) only needs to implement least circuitry, implementing high-speed inter-chip connection with the inter-chip connection circuits 411 and 412 (FIG. 4) may increase cost.

In the embodiments of FIG. 2 to FIG. 4, the converters DA[.] and AD[.] are partitioned at frequency interfaces of the same frequencies. In FIG. 2, each converter DA[p] and each converter AD[q] are partitioned at frequency interfaces of frequency L*M*fs. In FIG. 3, each converter DA[p] and each converter AD[q] are partitioned at frequency interfaces of frequency L*fs. In FIG. 4, each converter DA[p] and each converter AD[q] are partitioned at frequency interfaces of frequency L*M*N*fs. However, converters DA[p] and AD[q] can be partitioned at frequency interfaces of different frequencies. Please refer to FIG. 5 and FIG. 6 respectively illustrating signal processing systems 500 and 600 according to embodiments of the invention.

Figure 5:
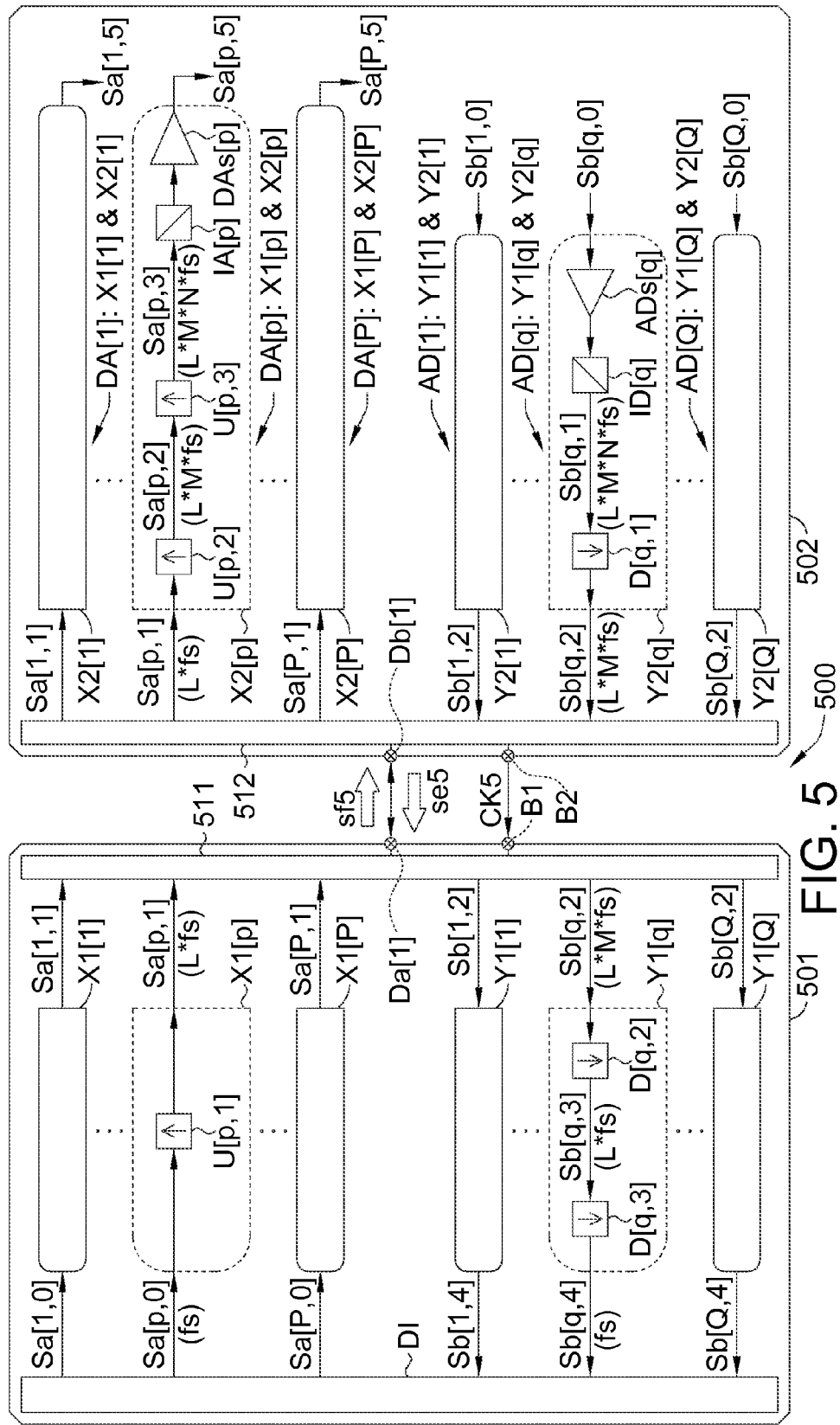

Similar to FIG. 2 to FIG. 4, the signal processing system 500 shown in FIG. 5 distributes across two chips 501 and 502, and includes converters DA[1] to DA[P] for digital-to-analog conversion and converters AD[1] to AD[Q] for analog-to-digital conversion. Each converter DA[p] (for p=1 to P) receives a digital input signal Sa[p,0] of sampling frequency fs from a digital interface circuit DI, and includes units U[p,1] to U[p,3] for up-sampling, so the signal Sa[p,0] of frequency fs is converted to a signal Sa[p,1] of frequency L*fs, a signal Sa[p,2] of frequency L*M*fs, and a signal Sa[p,3] of frequency L*M*N*fs. Each converter AD[q] (q=1 to Q) performs sigma-delta analog-to-digital conversion on an analog input signal Sb[q,0] to accordingly provide a digital signal Sb[q,1] of sampling frequency L*M*N*fs, and includes units D[q,1] to D[q,3] for down-sampling, so the signal Sb[q,1] of frequency L*M*N*fs is converted to a signal Sb[q,2] of frequency L*M*fs, a signal Sb[q,3] of frequency L*fs, and a signal Sb[q,4] of frequency fs.

With the amount K kept equal to 1, one difference between embodiments of FIG. 2 to FIG. 5 is that DAC and ADC of the signal processing system 500 in FIG. 5 are respectively partitioned at frequency interfaces of different frequencies. Each converter DA[p] is partitioned at a frequency interface associating with the signal Sa[p,1] of frequency L*fs, and each converter AD[q] is partitioned at a frequency interface associating with the signal Sb[q,2] of higher frequency L*M*fs. Accordingly, each converter DA[p] is segmented to two portions X1[p] and X2[p] respectively implemented by the chip 501 and 502; the portion X1[p] includes the unit U[p,1], and the portion X2[p] includes the units U[p,2] and U[p,3]. The signals Sa[1,1] to Sa[P,1] of frequency L*fs respectively provided by the portions X1[1] to X1[P] are transmitted to the portions X2[1] to X2[P] via a single stream sf5 over a single pair of data balls Da[1] and Db[1] of inter-chip connection circuits 511 and 512.

Similarly, each converter AD[q] is segmented to two portions Y1[q] and Y2[q] respectively implemented by the chip 501 and 502; the portion Y1[q] includes the unit D[q,3] and D[q,2], and the portion Y2[q] includes the units D[q,1]. The signals Sb[1,2] to Sb[Q,2] of frequency L*M*fs respectively provided by the portions Y2[1] to Y2[Q] are sent to the portions Y1[1] to Y1[Q] via a single stream se5 over the single pair of data balls Db[1] and Da[1]. A clock CK5 from a clock ball B2 of the chip 502 to a clock ball B1 of the chip 501 is arranged to clock the streams sf5 and se5. Comparing to the stream sf5, because the stream se5 has to serialize the signals Sb[1,2] to Sb[Q,2] of higher frequency L*M*fs, clock rate of the clock CK5 can be determined according to the higher partitioning frequency L*M*fs, so as to satisfy timing requirement of the stream se5. On the other hand, the stream sf5 only needs to serialize the signals Sa[1,1] to Sa[P,1] of lower frequency L*fs, so the stream sf5 can be clocked by a frequency-divided version of the clock CK5.

Figure 6:
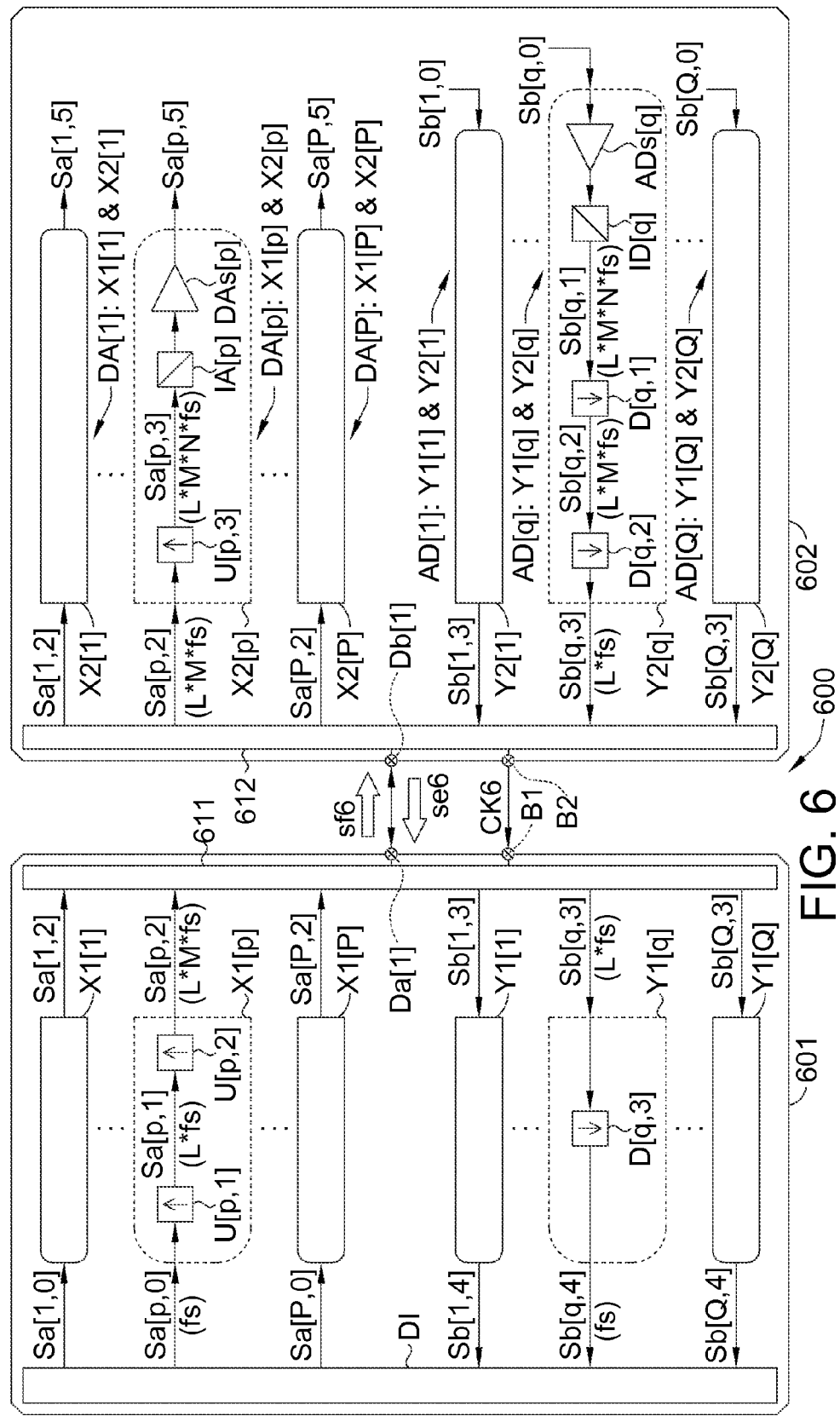

Similar to FIG. 2 to FIG. 5, the signal processing system 600 shown in FIG. 6 is collectively implemented by two chips 501 and 502, and includes converters DA[1] to DA[P] for digital-to-analog conversion and converters AD[1] to AD[Q] for analog-to-digital conversion. Each converter DA[p] (for p=1 to P) receives a digital input signal Sa[p,0] of sampling frequency fs from a digital interface circuit DI, and includes units U[p,1] to U[p,3] for up-sampling, so the signal Sa[p,0] of frequency fs is converted to a signal Sa[p,1] of frequency L*fs, a signal Sa[p,2] of frequency L*M*fs, and a signal Sa[p,3] of frequency L*M*N*fs. Each converter AD[q] (q=1 to Q) performs sigma-delta analog-to-digital conversion on an analog input signal Sb[q,0] to accordingly provide a digital signal Sb[q,1] of sampling frequency L*M*N*fs, and includes units D[q,1] to D[q,3] for down-sampling, so the signal Sb[q,1] of frequency L*M*N*fs is converted to a signal Sb[q,2] of frequency L*M*fs, a signal Sb[q,3] of frequency L*fs, and a signal Sb[q,4] of frequency fs.

With the amount K kept equal to 1, one difference between embodiments of FIG. 2 to FIG. 6 is that DAC and ADC of the signal processing system 600 in FIG. 6 are respectively partitioned at frequency interfaces of a higher frequency and a lower frequency. Each converter DA[p] is partitioned at a frequency interface associating with the signal Sa[p,2] of frequency L*M*fs, and each converter AD[q] is partitioned at a frequency interface associating with the signal Sb[q,3] of lower frequency L*fs. Accordingly, each converter DA[p] is segmented to two portions X1[p] and X2[p] respectively implemented by the chip 601 and 602; the portion X1[p] includes the units U[p,1] and U[p,2], and the portion X2[p] includes the unit U[p,3]. The signals Sa[1,2] to Sa[P,2] of frequency L*M*fs respectively provided by the portions X1[1] to X1[P] are transmitted to the portions X2[1] to X2[P] via a single stream sf6 over a single pair of data balls Da[1] and Db[1] of inter-chip connection circuits 611 and 612.

Similarly, each converter AD[q] is segmented to two portions Y1[q] and Y2[q] respectively implemented by the chip 601 and 602; the portion Y1[q] includes the unit D[q,3], and the portion Y2[q] includes the units D[q,1] and D[q,2]. The signals Sb[1,3] to Sb[Q,3] of frequency L*fs respectively provided by the portions Y2[1] to Y2[Q] are sent to the portions Y1[1] to Y1[Q] via a single stream se6 over the single pair of data balls Db[1] and Da[1]. A clock CK6 from a clock ball B2 of the chip 602 to a clock ball B1 of the chip 601 is arranged to clock the streams sf6 and se6. Because the stream sf6 has to serialize the signals Sa[1,2] to Sa[P,2] of higher frequency L*M*fs, clock rate of the clock CK6 can be determined according to the higher partitioning frequency L*M*fs, so as to satisfy timing requirement of the stream sf6. On the other hand, the stream se6 only needs to serialize the signals Sb[1,3] to Sb[Q,3] of lower frequency L*fs, so the stream se6 can be clocked by a frequency-divided version of the clock CK6.

From FIG. 2 to FIG. 4 and FIG. 5 to FIG. 6, it is understood that frequencies of partitioning frequency interfaces which segment each converter DA[p] to two portions and each converter AD[q] to two portions can be the same or different. That is, with each converter DA[p] partitioned at a frequency interface of the signal Sa[p,ix] and each converter AD[q] partitioned at a frequency interface of the signal Sb[q,jx], frequencies of the signals Sa[p,ix] and Sb[q,jx] can be the same or different. In the embodiments shown in FIG. 2 to FIG. 4, frequencies of the signals Sa[p,ix] and Sb[q,jx] are the same, while in the embodiments shown in FIG. 5 and FIG. 6, frequencies of the signals Sa[p,ix] and Sb[q,jx] are different. As discussed referring to FIG. 5 and FIG. 6, if frequencies of the signals Sa[p,ix] and Sb[q,jx] are selected to differ, clock rate for clocking the inter-chip stream(s) can be determined to the one of higher frequency.

Figure 7:
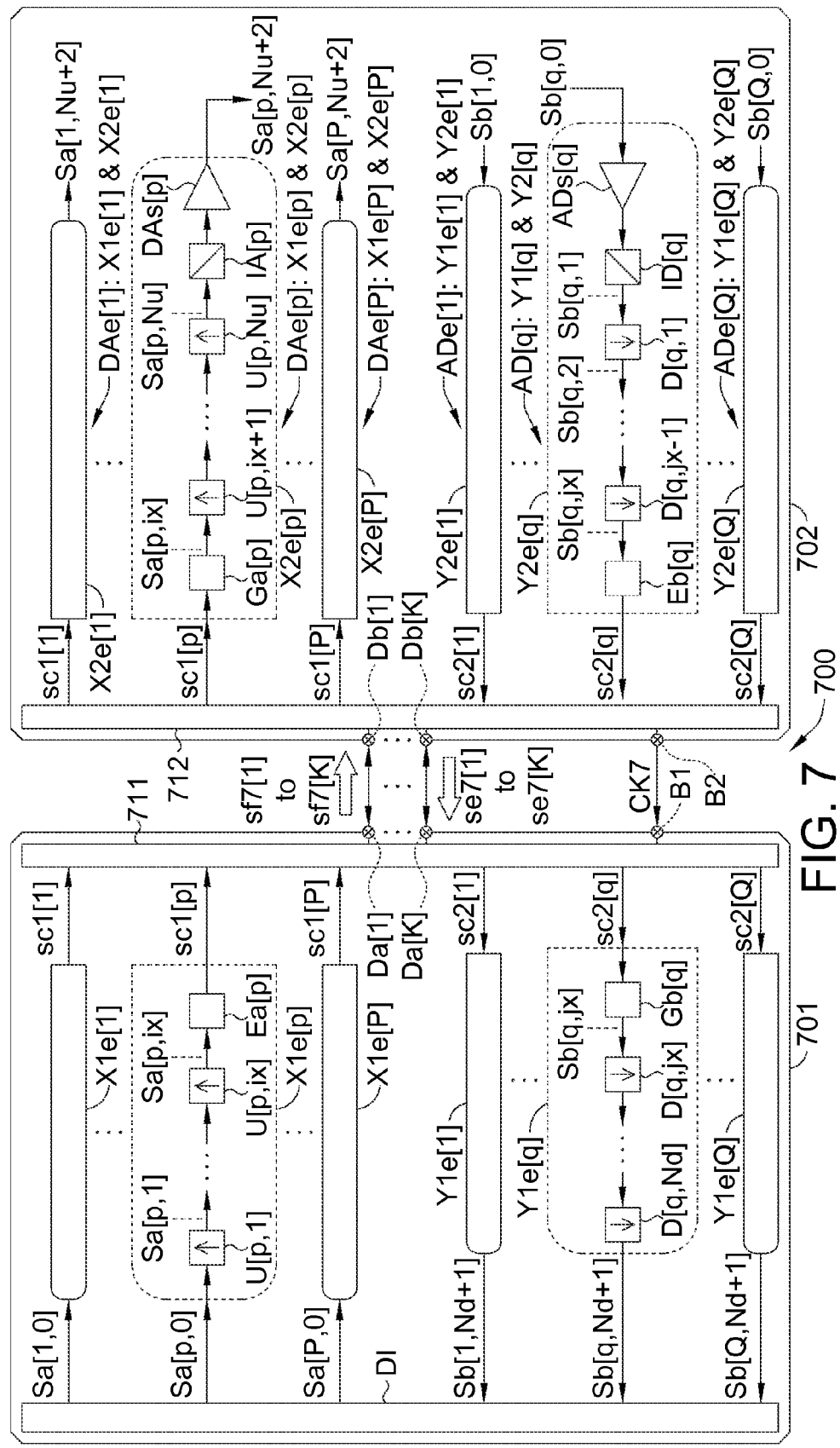

Please refer to FIG. 7 illustrating a signal processing system 700 according to an embodiment of the invention. Like the embodiment shown in FIG. 1, the signal processing system 700 distributes across two chips 701 and 702, and includes a number P of converters DAe[1] to DAe[P] for digital-to-analog conversion, a number Q of converters ADe[1] to ADe[Q] for analog-to-digital conversion, and two inter-chip connection circuits 711 and 712 respectively formed in the chips 701 and 702. The chip 701 has an amount K of data balls Da[1] to Da[K] and a clock ball B1 respectively coupled to the same amount K of data balls Db[1] to Db[K] and a clock ball B2 of the chip 702.

In the signal processing system 700, each converter DAe[p] (for p=1 to P) can be a sigma-delta DAC capable of converting a digital input signal Sa[p,0] to an analog output signal Sa[p,Nu+2], and includes a number Nu of serially coupled frequency conversion units U[p,1] to U[p,Nu], a DAC interface circuit IA[p], a DAC stage DAs[p], an encoding stage Ea[p] and a decoding stage Ga[p]. The unit U[p,1] can receive the signal Sa[p,0] from an digital interface circuit DI in the chip 701, and provide an up-sampled signal Sa[p,1] for the next unit U[p,2] (not shown); similarly, each following unit U[p,i] (for i greater than 1) can receive a signal Sa[p,i−1] (not shown) provided by a previous unit U[p,i−1] (not shown) and provide an up-sampled signal Sa[p,i] (not shown) of higher frequency. The DAC interface circuit IA[p] is capable of modulating a signal Sa[p,Nu] provided by the last unit U[p,Nu] to form a modulated digital signal Sa[p,Nu+1] by sigma-delta modulation, and the DAC stage DAs[p] is capable of converting the modulated signal Sa[p,Nu+1] to the analog output signal Sa[p,Nu+2].

Each converter DAe[p] is partitioned to two portions X1e[p] and X2e[p] respectively formed in the chips 701 and 702. With an index ix selected from 1 to Nu, the portion X1e[p] includes the units U[p,1] to U[p,ix] and the encoding stage Ea[p] which is coupled between the unit U[p,ix] and the inter-chip connection circuit 711. The portion X2e[p] includes the units U[p,ix+1] to U[p,Nu], the DAC interface circuit IA[p], the DAC stage DAs[p] and the decoding stage Ga[p] which is coupled between the inter-chip connection circuit 712 and the unit U[p,ix+1].

To accomplish conversion function of the converter DA[p], the signal Sa[p,ix] provided by the unit U[p,ix] of the portion X1e[p] needs to be transferred across chips to the unit U[p,ix+1] of the portion X2e[p]. For transfer of the signal Sa[p,ix], the encoding stage Ea[p] of each converter DAe[p] is capable of encoding the signal Sa[p,ix] to provide an encoded signal sc1[p]. For example, the encoding stage Ea[p] can encode each sample in the signal Sa[p,ix] to a corresponding encoded word of the signal sc1[p]. Accordingly, the inter-chip connection circuit 711 can collectively arrange encoded words in the signals sc1[1] to sc1[P] of the portions X1e[1] to X1e[P] to form an amount K of streams sf7[1] to sf7[K], and transmit the streams sf7[1] to sf7[K] via the balls Da[1] to Da[K]. Under clocking of a clock CK7 provided by the inter-chip connection circuit 712 to the inter-chip connection circuit 711, the inter-chip connection circuit 712 can receive the streams sf7[1] to sf7[K] via the balls Db[1] to Db[K], rearrange encoded words in the received streams sf7[1] to sf7[K], and accordingly obtain the signals sc1[1] to sc1[P]. Hence, each decoding stage Ga[p] (for p=1 to P) can decode the associated signal sc1[p] to obtain the signal Sa[p,ix] for the next unit U[p,ix+1], e.g., decode each encoded word in the signal sc1[p] to obtain a sample of the signal Sa[p,ix].

For a special case when the index ix is selected equal to Nu, the portion X1e[p] has all the units U[p,1] to U[p,Nu] and the encoding stage Ea[p] which encodes the signal Sa[p,Nu] provided by the unit U[p,Nu] to form the signal sc1[p]. In the portion X2e[p], no unit U[p,i] is arranged between the decoding stage Ga[p] and the DAC interface circuit IA[p]; the decoding stage Ga[p] decodes the signal sc1[p] obtained by the inter-chip connection circuit 712 to form the signal Sa[p,Nu] for the DAC interface circuit IA[p], so the DAC interface circuit IA[p] and the DAC stage DAs[p] can continue to form the signal Sa[p,Nu+2].

In the signal processing system 700, each converter ADe[q] (for q=1 to Q) can be a sigma-delta ADC capable of converting an analog input signal Sb[q,0] to a digital output signal Sb[q,Nd+1], and includes a number Nd of serially coupled frequency conversion units D[q,1] to D[q,Nd], an ADC interface circuit ID[q], an ADC stage ADs[q], an encoding stage Eb[q] and a decoding stage Gb[q]. In response to the signal Sb[q,0], the ADC stage ADs[q] and the ADC interface circuit ID[q] cooperate to form a digital signal Sb[q,1] of high sampling frequency by sigma-delta analog-to-digital conversion. The unit D[q,1] can receive the signal Sb[p,1] to provide a down-sampled signal Sb[q,2] for the next unit D[q,2] (not shown); similarly, each following unit D[q,j] (for j greater than 1) can receive a signal Sb[q,j] (not shown) provided by a previous unit D[q,j−1] (not shown) and provide a down-sampled signal Sb[q,j+1] (not shown), so the last unit D[q,Nd] can provide the signal Sb[q,Nd+1] for the digital interface circuit DI.

Each converter ADe[q] is partitioned to two portions Y1e[q] and Y2e[q] respectively formed in the chips 701 and 702. With an index jx selected from 1 to Nd, the portion Y2e[q] includes the ADC interface circuit ID[q], the ADC stage ADs[q], the units D[q,1] to D[q,jx−1] and the encoding stage Eb[q] which is coupled between the unit D[q,jx−1] and the inter-chip connection circuit 712. The portion Y1e[q] includes the units D[q,jx] to D[q,Nd] and the decoding stage Gb[q] which is coupled between the inter-chip connection circuit 711 and the unit D[q,jx].

To accomplish conversion function of the converter AD[q], the signal Sb[q,jx] provided by the unit D[q,jx−1] of the portion Y2e[q] needs to be transferred across chips to the unit D[q,jx] of the portion Y1e[q]. For transfer of the signal Sq[q,jx], the encoding stage Eq[q] of each converter ADe[q] is capable of encoding the signal Sb[q,jx] to provide an encoded signal sc2[q], e.g., encoding each sample in the signal Sb[q,jx] to an encoded word of the signal sc2[q]. Accordingly, the inter-chip connection circuit 712 can collectively arrange encoded words in the signals sc2[1] to sc2[Q] of the portions Y2e[1] to Y2e[Q] to form an amount K of streams se7[1] to se7[K], and transmit the streams se7[1] to se7[K] via the balls Db[1] to Db[K]. The inter-chip connection circuit 711 can receive the streams se7[1] to se7[K] via the balls Da[1] to Da[K], rearrange encoded words in the received streams se7[1] to se7[K], and accordingly obtain the signals sc2[1] to sc2[Q]. Hence, each decoding stage Gb[q] (for q=1 to Q) can decode the associated signal sc2[q] to obtain the signal Sb[q,jx] for the next unit D[q,jx].

For a special case when the index jx is selected equal to 1, the portion Y2e[q] includes no unit D[q,j] between the ADC interface circuit ID[q] and the encoding stage Eb[q], which encodes the signal Sb[q,1] of the ADC stage ADs[q] and the ADC interface circuit ID[q] to provide the signal sc2[q]. The portion Y1e[q] has all the units D[q,1] to D[p,Nd] and the decoding stage Gb[q] which decodes the signal sc2[q] obtained by the inter-chip connection circuit 711 to form the signal Sb[q,1] for the first unit D[q,1].

The encoding and decoding schemes adopted by each pair of the encoding/decoding stages Ea[p] and Ga[p] as well as each pair of the encoding/decoding stages Eb[q] and Gb[q] can includes: data compression and decompression, data scrambling and de-scrambling, and/or other coding-decoding methodology, e.g., encoding by mapping each sample to a word of maximum or minimum bit transitions, and decoding by inverse mapping. Data compression and decompression can be based on run-length coding and decoding, and/or Huffman coding and decoding, etc., such that each sample in the signal Sa[p,ix] or Sb[q,jx] can be encoded to an encoded word of fewer bits. Encoding and decoding schemes of the encoding/decoding stages Ea[p] and Ga[p] can be the same as or different from those adopted by the encoding/decoding stages Eb[q] and Gb[q].

With the encoding and decoding stages Ea[p], Ga[p], Eb[q] and Gb[q], clock rate of the clock CK7, as well as throughput of the streams sf7[1] to sf7[K] and se7[1] to se7[K], can be determined according to at least one of: values of the numbers P and Q, the amount K, number of bits in each encoded word of the signals Sc1[p] and Sc2[q] (and error correction information), and sampling frequencies of the signals Sa[p,ix] and Sb[q,jx]. For example, consider the embodiments in FIG. 1 and FIG. 7; assuming all the numbers P, Q, Nu, Nd and the amount K are the same for both embodiments, then clock rate of the clock CK7 (FIG. 7) can be set lower than that of the clock CK1 (FIG. 1) if each encoding stage Ea[p] and each encoding stage Eb[q] adopt data compression schemes for encoding each sample of the signals Sa[p,ix] and Sb[q,jx] to a shorter encoded word of the signals sc1[p] and sc2[q]. Although lower clock rate may reduce implement cost of entire signal processing system 700, area overhead of the encoding and decoding stages may compromise effect of cost reduction. Computer cost evaluation can reveal whether encoding and decoding actually decrease or increase cost.

Figure 8:
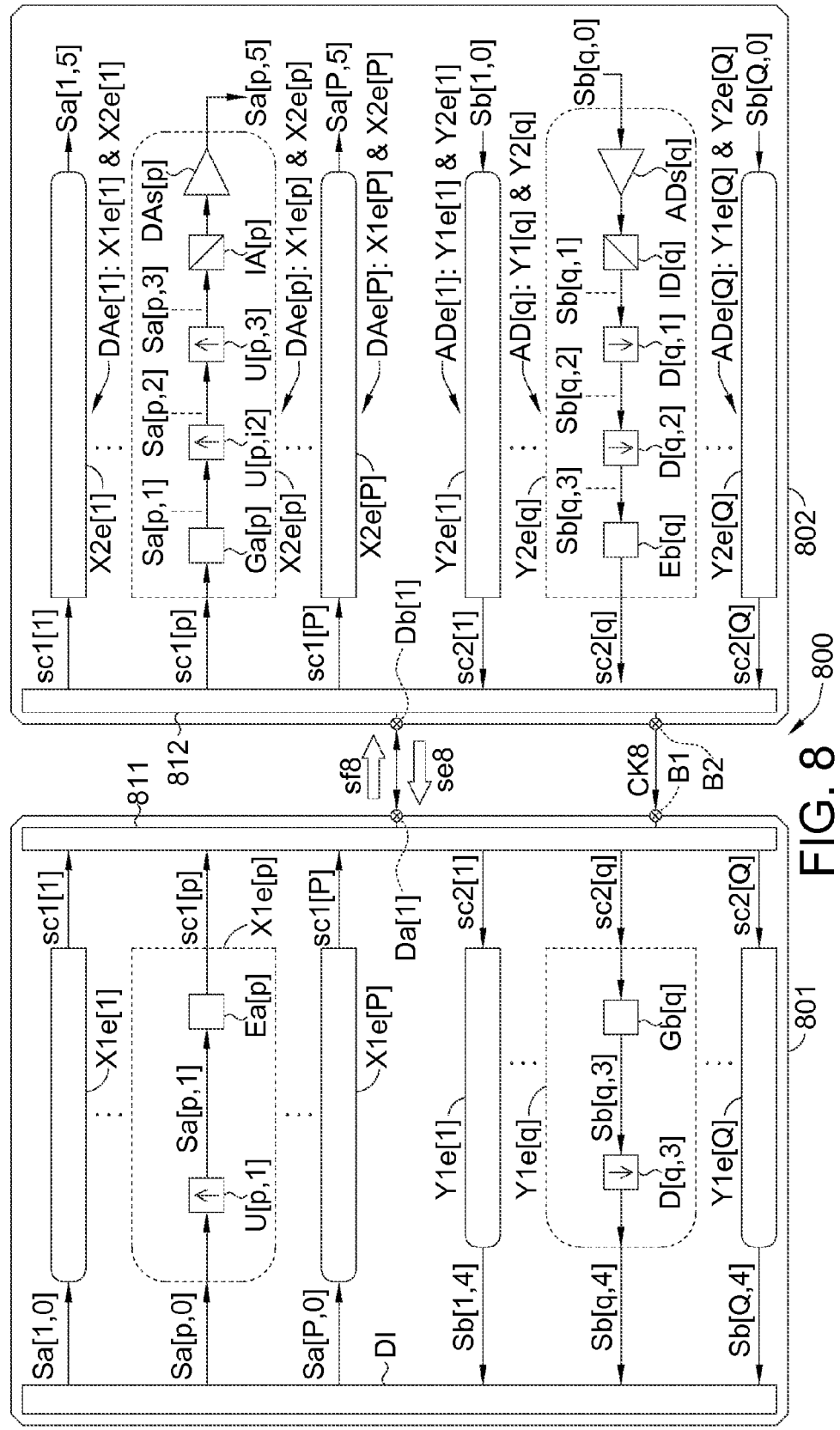

Please refer to FIG. 8 illustrating a signal processing system 800 which exemplifies the architecture shown in FIG. 7 with the numbers Nu=Nd=3 and the selection (ix,jx, K)=(1,3,1). The signal processing system 800 distributes across two chips 801 and 802, and includes converters DAe[1] to DAe[P] for digital-to-analog conversion and converters ADe[1] to ADe[Q] for analog-to-digital conversion. Each converter DAe[p] (for p=1 to P) receives a digital input signal Sa[p,0] from a digital interface circuit DI, and includes units U[p,1] to U[p,3] for up-sampling, so the signal Sa[p,0] is successively converted to signals Sa[p,1], Sa[p,2] and Sa[p,3] by up-sampling; for example, sampling frequencies of the signals Sa[p,0], Sa[p,1], Sa[p,2] and Sa[p,3] can respectively be fs, L*fs, L*M*fs and L*M*N*fs. Each converter ADe[q] (q=1 to Q) performs sigma-delta analog-to-digital conversion on an analog input signal Sb[q,0] to accordingly provide a digital signal Sb[q,1], and includes units D[q,1] to D[q,3] for down-sampling, so the signal Sb[q,1] can be successively converted to the signals Sb[q,2], Sb[q,3] and Sb[q,4]; for example, frequencies of the signals Sb[q,1], Sb[q,2], Sb[q,3] and Sb[q,4] can respectively be L*M*N*fs, L*M*fs, L*fs and fs.

The signal processing system 800 is partitioned at a frequency interface associated with the signals Sa[p,1] and Sb[q,3]. Accordingly, each converter DAe[p] is segmented to two portions X1e[p] and X2e[p] by two inter-chip connection circuits 811 and 812 respectively formed in the chip 801 and 802. The portion X1e[p] is formed in the chip 801, includes the unit U[p,1] for providing the signal Sa[p,1] and an encoding stage Ea[p] for encoding the signal Sa[p,1] to form a signal sc1[p]. The portion X2e[p] is formed in the chip 802, includes a decoding stage Ga[p] for decoding the signal sc1[p] to obtain the signal Sa[p,1], and the units U[p,2] to U[p,3]. With the amount K selected equal to 1, the inter-chip connection circuit 811 can serialize the signals sc1[1] to sc1[P] of the portions X1e[1] to X1e[P] to a single stream sf8, which is transmitted via a single data ball Da[1] of the ship 801. Under clocking of a clock CK8 from a clock ball B2 of the chip 802 to a clock ball B1 of the chip 801, the inter-chip connection circuit 812 can receive the stream sf8 via a single data ball Db[1] of the chip 802 and de-serialize the stream sf8 to obtain the signals sc1[1] to sc1[P].

Similarly, each converter ADe[q] is segmented to two portions Y1e[q] and Y2e[q] respectively implemented by the chip 801 and 802. The portion Y2e[q] includes the units D[q,2], D[q,1] and an encoding stage Eb[q] for encoding the signal Sb[q,3] to form a signal sc2[q]. The inter-chip connection circuit 812 can serialize the signals sc2[1] to sc2[Q] of the portion Y2e[1] to Y2e[Q] to a single stream se8, which is transmitted via the single data ball Db[1] of the ship

802. The inter-chip connection circuit 811 can receive the stream se8 via the single data ball Da[1] of the chip 801, and de-serialize the stream se8 to obtain the signals sc2[1] to sc2[Q]. The portion Y1e[q] includes a decoding stage Gb[q] for decoding the signal sc2[q] to obtain the signal Sb[q,3], and the unit D[q,3].

Besides the example illustrated in FIG. 8, by properly varying selection setting of the architecture shown in FIG. 7, the encoding and decoding stages Ea[p], Eb[q], Ga[p] and Gb[q] can also be included in the examples shown in FIG. 2 to FIG. 6.

Although each of the signal processing systems shown in FIG. 1 to FIG. 8 is distributed across two chips, the signal processing system may be distributed among more chips, e.g., three chips. For example, each converter DA[p] may be portioned to three portions X1[p], X2[p] and X3[p] respectively formed by 3 chips (not shown); the portion X1[p] includes the units U[p,1] to U[p,ix1], the portion X2[p] includes the units U[p,ix1+1] to U[p,ix2], and the portion X3[p] includes the units U[p,ix2+1] to U[p,Nu], the DAC interface circuit IA[p] and the DAC stage DAs[p]. Signal output by the unit U[p,ix1] is relayed to the unit U[p,ix1+1] by a first inter-chip connection circuit and a second inter-chip connection circuit respectively formed in the first chip and the second chip, and signal output by the unit U[p,ix2] is relayed to the unit U[p,ix2+1] by a third inter-chip connection circuit and a fourth inter-chip connection circuit respectively formed in the second chip and the third chip.

Figure 9:
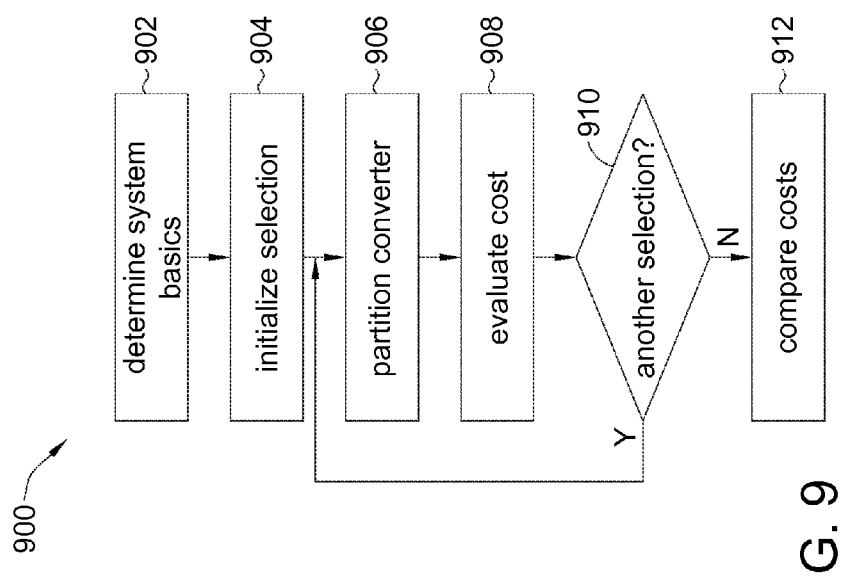
FIG. 9. Illustrates a design flow according to an embodiment of the invention.

Please refer to FIG. 9 illustrating a design flow 900 according to an embodiment of the invention. The flow 900 can be utilized to determine how to implement a distributed signal processing system with preferred cost; e.g., how to design or manufacture the signal processing system 100 in FIG. 1 or the signal processing system 700 in FIG. 7 of lowest cost. Main steps of the flow 900 can be described as follows.

Step 902: determine basics of the signal processing system, including: numbers of converters (e.g., the numbers P and Q respectively for the DACs and ADCs in FIG. 1 or FIG. 7) arranged in the signal processing system, and numbers of frequency conversion units included in each of the converters, e.g., the numbers Nu and Nd respectively for the unit U[p,i] in each DAC and the unit D[q,j] in each ADC, as shown in FIG. 1 or FIG. 7. Also, determine processes respectively adopted to manufacture a first and a second chips where the signal processing system distributes. With the frequency conversion units, each of the DACs and ADCs associates with frequency interfaces of different frequencies.

Step 904: initialize a selection which directs where to partition each of the converters (ADCs and DACs) to a first portion and a second portions, as well as how to establish inter-chip connection between each pair of the first and second portions. For example, the selection can include selected values of the indices ix, jx and the amount K shown in FIG. 1 or FIG. 7. The selection can also comprise whether encoding/decoding stages are included in each of the DACs and ADCs; that is, the selection can also direct which one of the two architectures shown in FIG. 1 and FIG. 7 is adopted.

Step 906: according to the selection of preceding step, perform a partitioning step to obtain a plan for: partitioning each of the converters to the first portion in the first chip and the second portion in the second chip at a selected one of the frequency interfaces of each converter, and communicating all the first and second portions with proper clock rate and throughput under an amount K of inter-chip wirings. In addition, the plan can also include whether and how encoding/decoding stages are embedded.

Step 908: by computer, perform a cost evaluation step for calculating a cost required to: form all the first portions in the first chip, form the second portion in the second chip, and implement the inter-chip connection relaying signal between all the first portions and second portions with the amount K specified in the selection.

Step 910: if there is another different selection, accordingly iterate step 906; otherwise, proceed to step 912. Thus, step 906 and 908 can be repeated multiple times to obtain multiple costs, each of the costs are calculated under one of different selections. Different selections can be provided by one or more of the following: changing the selected partitioning frequency interface of each DAC and/or each ADC, e.g., changing the index ix and/or the index jx; and changing value of the amount K. For example, the embodiments shown in FIG. 2 to FIG. 6 respectively correspond to selections (ix,jx,K)=(2,2,1), (1,3,1), (3,1,1), (1,2,1) and (2,3,1); thus, steps 906 and 908 can repeat five times to obtain five costs. Different selections can also be provided by choosing one of the two architectures shown in FIG. 1 and FIG. 7; hence, cost(s) corresponding to the architecture of FIG. 1 and cost(s) corresponding to the architecture of FIG. 7 can both be evaluated and compared.

Step 912: compare costs respectively calculated after repeats of steps 906 and 908, so the costs can be compared (sorted) by computer to choose a selection which can optimize (minimize) implement cost. For example, the flow 900 can evaluate three costs for the three selections respectively shown in FIG. 2 to FIG. 4; if the selection (ix,jx,K) of FIG. 2 corresponds to the lowest cost, then the selection of FIG. 2 is adopted to implement a three-level up-sampling/down-sampling conversion between analog and digital.

To sum up, by taking advantage of multi-level up-sampling and down-sampling of sigma-delta digital-to-analog and analog-to-digital conversions, the invention provides flexibility to optimize a signal processing system distributed across two chips. The optimization can achieve a preferred (or best) balance between affecting factors including: inter-chip throughput and clock rate, layout areas, pin-count (ball count) and processes to manufacturing the two chips.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A signal processing system distributed across a first chip and a second chip, comprising:
   a first inter-chip connection circuit formed in the first chip,
   a second inter-chip connection circuit formed in the second chip and coupled to the first inter-chip connection circuit, and
   a quantity of converters for conversion between digital and analog;
   each of the quantity of converters comprising:
      a plurality of serially coupled units forming a plurality of frequency interfaces, different ones of the frequency interfaces respectively associating with different frequencies, and each of the units capable of converting frequencies between two consecutive ones of the frequency interfaces;

wherein the first inter-chip connection circuit and the second inter-chip connection circuit partition each converter to a first portion and a second portion at a corresponding one of the frequency interfaces of each converter, the first portion and the second portion of each converter are respectively formed in the first chip and the second chip, and the first inter-chip connection circuit and the second inter-chip connection circuit are arranged to relay signal between the first portion and the second portion of each converter.

2. The signal processing system of claim 1, the quantity of converters including a digital-to-analog converter (DAC), the DAC being capable of converting a digital input signal to an analog output signal, and further comprising:
   a DAC interface circuit coupled to a last of the units of the DAC, and
   a DAC stage coupled to the DAC interface circuit;
   wherein a first of the units of the DAC is capable of receiving the digital input signal and accordingly providing a signal of a higher sampling frequency, each of the units following the first of the units is capable of receiving a signal provided by a preceding one of the units and accordingly providing another signal of a higher sampling frequency to a successive one of the units; the DAC interface circuit is capable of modulating a signal provided by the last of the units to form a modulated signal by sigma-delta modulation, and the DAC stage is capable of converting the modulated signal to the analog output signal.

3. The signal processing system of claim 1, the quantity of converters including an analog-to-digital converter (ADC); the ADC being capable of converting an analog input signal to a digital output signal, and further comprising:
   an ADC interface circuit coupled to a first of the units of the ADC, capable of providing a second modulated signal in response to the analog input signal by sigma-delta modulation;
   wherein a first of the units of the ADC is capable of receiving the second modulated signal and accordingly providing a signal of a lower sampling frequency, each of the units between the first and a last of the units is capable of receiving a signal provided by a preceding one of the units and accordingly providing another signal of a lower sampling frequency to a successive one of the units, and the last of the units is capable of receiving a signal provided by a preceding one of the units and accordingly providing the digital output signal of a lower sampling frequency.

4. The signal processing system of claim 1, wherein:
   the quantity of converters include a first number of first kind converters, each first kind converter is capable of providing a first inter-unit signal to be transferred from a first portion to a second portion of each first kind converter,
   the first inter-chip connection circuit is capable of arranging samples in a first number of first inter-unit signals to form a first amount of first streams, and transmitting the first amount of first streams respectively via a same amount of first data balls of the first inter-chip connection circuit, and
   the second inter-chip connection circuit is capable of receiving the first amount of first streams via a same amount of second data balls of the second inter-chip connection circuit respectively coupled to the first amount of first data balls, rearranging samples in the first amount of first streams, and accordingly obtaining the first number of first inter-unit signals for the first number of second portions of the first number of first kind converters.

5. The signal processing system of claim 4, wherein the first inter-chip connection circuit is further capable of adding error correction information to the first amount of first streams according to the first number of first inter-unit signals, and
   the second inter-chip connection circuit is further capable of correcting the received first amount of first streams in response to the error correction information while obtaining the first number of first inter-unit signals.

6. The signal processing system of claim 4, wherein the first amount of first streams is less than the first number.

7. The signal processing system of claim 4, wherein:
   each first kind converter further comprises:
      a first encoding stage in the first portion of each first kind converter, and
      a first decoding stage in the second portion of each first kind converter;
   wherein the first encoding stage of each first kind converter is capable of encoding the first inter-unit signal of each first kind converter to provide a first encoded signal; the first inter-chip connection circuit arranges the first number of first encoded signals of the first number of first kind converters to form the first amount of first streams, the second inter-chip connection circuit rearranges the first amount of first streams and accordingly obtains the first number of first encoded signals for the first number of second portions of the first number of first kind converters, and the first decoding stage of each first kind converter is capable of decoding an associated one of the first number of first encoded signals obtained by the second inter-chip connection circuit to obtain the first inter-unit signal for the second portion of each first kind converter.

8. The signal processing system of claim 4, wherein:
   the quantity of converters further includes a second number of second kind converters,
   each second kind converter is capable of providing a second inter-unit signal to be transferred from the second portion to the first portion of each second kind converter,
   the second inter-chip connection circuit is further capable of arranging samples in a second number of second inter-unit signals to form a second amount of second streams with the second amount equal to the first amount, and transmitting the second amount of second streams respectively via the first amount of second data balls, and
   the first inter-chip connection circuit is further capable of receiving the second amount of second streams from the first amount of first data balls, rearranging samples in the second amount of second streams, and accordingly obtaining the second number of second inter-unit signals for the second number of first portions of the second number of second kind converters.

9. The signal processing system of claim 8, wherein the second inter-chip connection circuit is further capable of adding second error correction information to the second amount of second streams according to the second number of second inter-unit signals, and
   the first inter-chip connection circuit is further capable of correcting the received second amount of second streams in response to the second error correction information while obtaining the second number of second inter-unit signals.

10. The signal processing system of claim 8, wherein the second amount of second streams is less than the second number.

11. The signal processing system of claim 8, wherein:
each second kind converter further comprises:
- a second encoding stage in the second portion of each second kind converter, and
- a second decoding stage in the first portion of each second kind converter;

wherein the second encoding stage of each second kind converter is capable of encoding the second inter-unit signal of each second kind converter to provide a second encoded signal; the second inter-chip connection circuit arranges the second number of second encoded signals of the second number of second kind converters to form the second amount of second streams, the first inter-chip connection circuit rearranges the second amount of second streams and accordingly obtains the second number of second encoded signals for the second number of first portions of the second number of second kind converters, and the second decoding stage of each second kind converter is capable of decoding an associated one of the second number of second encoded signals received by the first inter-chip connection circuit to obtain the second inter-unit signal for the first portion of each second kind converter.

12. The signal processing system of claim 8, wherein the frequency associated with the partitioning frequency interface of each first kind converter is equal to the frequency associated with the partitioning frequency interface of each second kind converter.

13. The signal processing system of claim 8, wherein a sampling frequency of each of the first number of first inter-unit signal equals a sampling frequency of each of the second number of second inter-unit signals.

14. The signal processing system of claim 8, wherein the frequency associated with the partitioning frequency interface of each first kind converter is different from the frequency associated with the partitioning frequency interface of each second kind converter.

15. The signal processing system of claim 8, wherein a sampling frequency of each of the first number of first inter-unit signals differs from a sampling frequency of each of the second number of second inter-unit signals.

16. A method for implementing a signal processing system across a first chip and a second chip, comprising:
arranging a quantity of converters, each converter accepting an input signal and accordingly providing an output signal by a conversion between digital and analog, wherein each converter is partitioned to a first portion formed in the first chip and a second portion formed in the second chip; one of the first portion and the second portion is capable of converting a sampling frequency of the input signal to provide an intermediate signal of a different sampling frequency; and
relaying the intermediate signal between the first portion and the second portion of each converter by a first inter-chip connection circuit formed in the first chip and a second inter-chip connection circuit formed in the second chip.

17. The method of claim 16, wherein the sampling frequency of the intermediate signal of each converter is between 4 to 16 times of the sampling frequency of the input signal of each converter.

18. The method of claim 16, wherein the quantity of converters includes a number of DACs, each DAC comprises a plurality of up-sampling filters, and each up-sampling filter is capable of increasing sampling frequency.

19. The method of claim 16, wherein the quantity of converters includes a number of ADCs, each ADC comprises a plurality of decimators, and each decimator is capable of decreasing sampling frequency.

* * * * *